United States Patent
Vrudhula et al.

(10) Patent No.: US 9,306,151 B2
(45) Date of Patent: Apr. 5, 2016

(54) THRESHOLD GATE AND THRESHOLD LOGIC ARRAY

(71) Applicant: Arizona Board of Regents, a body corporate of the State of Arizona, acting for and on behalf of Arizona State University, Scottsdale, AZ (US)

(72) Inventors: Sarma Vrudhula, Chandler, AZ (US); Nishant S. Nukala, Tempe, AZ (US); Niranjan Kulkarni, Phoenix, AZ (US)

(73) Assignee: Arizona Board of Regents, a body corporate of the State of Arizona, acting for and on behalf of Arizona State University, Scottsdale, AZ (US)

( * ) Notice: Subject to any disclaimer, the term of this patent is extended or adjusted under 35 U.S.C. 154(b) by 187 days.

(21) Appl. No.: 13/903,490

(22) Filed: May 28, 2013

(65) Prior Publication Data

US 2013/0313623 A1    Nov. 28, 2013

Related U.S. Application Data

(60) Provisional application No. 61/651,646, filed on May 25, 2012.

(51) Int. Cl.

| | |
|---|---|
| *G11C 11/15* | (2006.01) |
| *H01L 43/02* | (2006.01) |
| *H03K 19/18* | (2006.01) |
| *H03K 19/23* | (2006.01) |
| *H03K 19/20* | (2006.01) |

(52) U.S. Cl.
CPC ............... *H01L 43/02* (2013.01); *H03K 19/18* (2013.01); *H03K 19/20* (2013.01); *H03K 19/23* (2013.01)

(58) Field of Classification Search
CPC ................ G11C 11/16; G11C 11/15
USPC ................... 365/158; 326/35, 39
See application file for complete search history.

(56) References Cited

U.S. PATENT DOCUMENTS

| | | | |
|---|---|---|---|
| 5,859,548 A | 1/1999 | Kong |
| 5,991,789 A | 11/1999 | Prange et al. |
| 6,002,270 A | 12/1999 | Timoc |
| 6,046,608 A | 4/2000 | Theogarajan |
| 6,278,298 B1 | 8/2001 | Hayakawa |
| 6,381,181 B1 | 4/2002 | Nguyen |
| 6,392,467 B1 | 5/2002 | Oowaki et al. |

(Continued)

OTHER PUBLICATIONS

Beiu V. et al., "VLSI Implementations of Threshold Logic—A Comprehensive Survey," IEEE Transactions on Neural Networks, vol. 14, Issue 5, Sep. 2003, pp. 1217-1243.
Gowda T. et al., "Decomposition Based Approach for Synthesis of Multi-Level Threshold Logic Circuits," Design Automation Conference (ASPDAC), Mar. 21, 2008, 6 pages.
Gowda T. et al., "Synthesis of Threshold Logic Circuits Using Tree Matching," 18th European Conference on Circuit Theory and Design (ECCTD), Aug. 27, 2007, 4 pages.

(Continued)

*Primary Examiner* — Huan Hoang
(74) *Attorney, Agent, or Firm* — Withrow & Terranova, P.L.L.C.

(57) ABSTRACT

Threshold gates and related circuitry are disclosed. In one embodiment, a threshold gate includes a threshold realization element and a magnetic tunnel junction (MTJ) element. The MTJ element is switchable from a first resistive state to a second resistive state. To realize a threshold function with the MTJ element, the threshold realization element is configured to switch the magnetic tunnel junction element from the first resistive state to the second resistive state in accordance with the threshold function. In this manner, the threshold gate may implement a threshold function that provides an output just like a complex Boolean function requiring several Boolean gates.

27 Claims, 11 Drawing Sheets

(56) References Cited

U.S. PATENT DOCUMENTS

| | | | |
|---|---|---|---|
| 6,420,905 | B1 | 7/2002 | Davis et al. |
| 6,424,181 | B1 | 7/2002 | Pogrebnoy |
| 6,437,604 | B1 | 8/2002 | Forbes |
| 6,580,296 | B1 | 6/2003 | Beiu |
| 6,838,909 | B2 | 1/2005 | Huang et al. |
| 7,417,468 | B2 | 8/2008 | Verbauwhede et al. |
| 7,835,898 | B2 | 11/2010 | Geist et al. |
| 8,164,359 | B2 | 4/2012 | Leshner et al. |
| 8,181,133 | B2 | 5/2012 | Gowda et al. |
| 8,891,276 | B2 * | 11/2014 | Siau et al. ........................ 365/63 |
| 2002/0184174 | A1 | 12/2002 | Kadri |
| 2005/0262456 | A1 | 11/2005 | Prasad |
| 2006/0098477 | A1 * | 5/2006 | Sugibayashi et al. ......... 365/158 |
| 2006/0119406 | A1 | 6/2006 | Henzler et al. |
| 2009/0300563 | A1 | 12/2009 | Moon |
| 2011/0214095 | A1 | 9/2011 | Gowda et al. |

OTHER PUBLICATIONS

Hopcroft J.E. et al., "Synthesis of Minimal Threshold Logic Networks," IEEE Transactions of Electronic Computers, Aug. 1965, pp. 552-560.

Zhang R. et al., "Synthesis and Optimization of Threshold Logic Networks with Application to Nanotechnologies," Design, Automation and Test in Europe Conference and Exhibition, vol. 2, Feb. 16, 2004, 6 pages.

Luba T., "Multi-Level Logic Synthesis Based on Decomposition," Microprocessors and Microsystems, vol. 18, No. 8, Oct. 1994, pp. 429-437.

Avedillo M. J. et al., "A Threshold Logic Synthesis Tool for RTD Circuits," Proceedings of the EUROMICRO Systems on Digital System Design (DSD'04), 2004, 4 pages.

Avouris P. et al., "Carbon Nanotube Electronics," Proceedings of the IEEE, vol. 91, No. 11, Nov. 2003, pp. 1772-1784.

Blair E.P. et al., "Quantum-Dot Cellular Automata: An Architecture for Molecular Computing", Simulation of Semiconductor Processes and Devices, SISPAD, 2003, pp. 14-18.

Celinski P. et al., "State-of-the-Art in CMOS Threshold-Logic VLSI Gate Implementations and Applications," Proceedings of SPIE, vol. 5117, 2003, pp. 53-64.

Gowda T. et al., "Identification of Threshold Functions and Synthesis of Threshold Networks," IEEE Transactions on Computer-Aided Design of Integrated Circuits and Systems, vol. 30, No. 5, May 2011, pp. 665-677.

Gowda T. et al., "A Non-ILP Based Threshold Logic Synthesis Methodology," Proceedings of the IWLS, 2007, 8 pages.

Gowda T. et al., "Combinational Equivalence Checking for Threshold Circuits," GLSVLSI, Mar. 11-13, 2007, pp. 102-107, Stresa-Lago Maggiore, Italy.

Likharev K.K., "Single-Electron Devices and Their Applications," Proceedings of the IEEE, vol. 87, No. 4, Apr. 1999, pp. 606-632.

Sentovich E. et al., "SIS: A System for Sequential Circuit Synthesis," Memorandum No. UCB/ERL M92/41, Department of Electrical Engineering and Computer Science, May 4, 1992, 45 pages, University of California, Berkeley, CA.

Zhang R. et al., "Threshold Network Synthesis and Optimization and Its Application to Nanotechnologies," IEEE Transactions on Computer-Aided Design of Integrated Circuits and Systems, vol. 24, No. 1, Jan. 2005, pp. 107-118.

Zheng Y., "Novel RTD-Based Threshold Logic Design and Verification," Thesis Submitted to the Faculty of Virginia Polytechnic Institute and State University in Partial Fulfillment of the Requirements for the Degree of Master of Science in Computer Engineering, Apr. 28, 2008, 57 pages, Blacksburg, VA.

Bahar R.I. et al., "A Symbolic Method to Reduce Power Consumption of Circuits Containing False Paths," Proceedings of the 1994 IEEE/ACM International Conference of Computer-Aided Design, 1994, 4 pages.

Chatterjee S. et al., "Factor Cuts," ICCAD, Nov. 5-9, 2006, pp. 143-150, San Jose, CA.

Chuang W. et al., "A Unified Algorithm for Gate Sizing and Clock Skew Optimization to Minimize Sequential Circuit Area," ICCAD Proceedings of the 1993 IEEE/ACM International Conference of Computer-Aided Design, 1993, pp. 220-223.

Coudert O., "Gate Sizing for Constrained Delay/Power/Area Optimization," IEEE Transactions on Very Large Scale Integration (VLSI) Systems, vol. XX, No. Y, Sep. 1997, pp. 1-7.

Eppstein D., "Small Maximal Independent Sets and Faster Exact Graph Coloring," Journal of Graph Algorithms and Applications, vol. 7, No. 2, 2003, 9 pages.

Girard P. et al., "A Gate Resizing Technique for High Reduction in Power Consumption," 1997 International Symposium on Low Power Electronics and Design, Aug. 18-20, 1997, pp. 281-286, Monterey, CA.

Sun J.P. et al., "Resonant Tunneling Diodes: Models and Properties," Proceedings of the IEEE, vol. 86, No. 4, Apr. 1998, pp. 641-661.

Kagaris D. et al., "Maximum Weighted Independent Sets on Transitive Graphs and Applications," Integration, the VLSI Journal, vol. 27, 1999, pp. 77-86.

Leshner S. et al., "Design of a Robust, High Performance Standard Cell Threshold Logic Family for DSM Technology," 22nd International Conference on Microelectronics (ICM 2010), Copyright 2009, 4 pages.

Padure M. et al., "A New Latch-Based Threshold Logic Family," International Semiconductor Conference (CAS 2001), vol. 2, Copyright 2001, pp. 531-534.

Pan P. et al., "A New Retiming-Based Technology Mapping Algorithm for LUT-based FPGAs," Proceedings of the 1998 ACM/SIGDA Sixth International Symposium of Field Programmable Gate Arrays (FPGA '98), Copyright 1998, 8 pages.

Strandberg R. et al., "Single Input Current-Sensing Differential Logic (SCSDL)," IEEE International Symposium on Circuits and Systems (ISCAS 2000), May 28-31, 2000, pp. 1-764-1-767, Geneva, Switzerland.

Nukala N.S. et al., "Spintronic Threshold Logic Array—A Compact, Low Leakage, Non-Volatile Gate Array Architecture," 2012 IEEE/ACM International Symposium on Nanoscale Architectures (NANOARCH), Jul. 4-6, 2012, 8 pages.

Augustine C. et al., "Spin-Transfer Torque MRAMs for Low Power Memories: Perspective and Prospective," IEEE Sensors Journal, vol. 12, No. 4, Apr. 2012, pp. 756-766.

Gang Y. et al., "A High-Reliability, Low-Power Magnetic Full Adder," IEEE Transactions on Magnetics, vol. 47, No. 11, Nov. 2011, pp. 4611-4616.

Li J. et al., "Design Paradigm for Robust Spin-Torque Transfer Magnetic RAM (STT MRAM) From Circuit/Architecture Perspective," IEEE Transactions on Very Large Scale Integration (VLSI) Systems, vol. 18, No. 12, Dec. 2010, pp. 1710-1723.

Patil S. et al., "Spintronic Logic Gates for Spintronic Data Using Magnetic Tunnel Junctions," 2010 IEEE International Conference on Computer Design (ICCD), Oct. 3-6, 2010, 7 pages.

Zhang Y. et al., "Compact Modeling of Perpendicular-Anisotropy CoFeB/MgO Magnetic Tunnel Junctions," IEEE Transactions on Electron Devices, vol. 59, No. 3, Mar. 2012, pp. 819-826.

Zhao W. et al., "Spin-MTJ Based Non-Volatile Flip-Flop," Proceedings of the 7th IEEE International Conference on Nanotechnology, Aug. 2-5, 2007, pp. 399-402, Hong Kong.

Hulgaard H. et al., "Equivalence Checking of Combinational Circuits Using Boolean Expression Diagrams," IEEE Transactions on Computer-Aided Design of Integrated Circuits and Systems, Jul. 1999, 15 pages.

Kulkarni N. et al., "Technology Mapping for Power Using Threshold Logic Cells," GLSVLSI'11, May 2-4, 2011, 6 pages, Lausanne, Switzerland.

International Search Report and Written Opinion for PCT/US2009/061355 mailed Mar. 31, 2010, 12 pages.

* cited by examiner

THRESHOLD GATE AND THRESHOLD LOGIC ARRAY

RELATED APPLICATION

This application claims the benefit of provisional patent application Ser. No. 61/651,646, filed May 25, 2012, the disclosure of which is hereby incorporated herein by reference in its entirety.

FIELD OF THE DISCLOSURE

This disclosure relates generally to threshold gates and circuitry associated with threshold gates.

BACKGROUND

Often, various Boolean gates are required to implement a complex Boolean function. As the number of Boolean gates increases, the amount of space needed to provide the Boolean gates in an integrated circuit (IC) also increases. In addition, how fast the IC circuit can generate an output for the Boolean function, and the amount of power required by the IC circuit is determined by the number of Boolean gates needed to implement the Boolean function. Furthermore, Boolean gates are volatile and thus cannot store an output for the Boolean function if the power is turned off.

Accordingly, there is a need to reduce the number of Boolean gates required by an IC circuit.

SUMMARY

Threshold gates and related circuitry are disclosed in this disclosure. The threshold gate may implement a threshold function that provides an output just like a complex Boolean function requiring numerous Boolean gates. In one embodiment, a threshold gate includes a threshold realization element and a magnetic tunnel junction (MTJ) element. The MTJ element is switchable from a first resistive state to a second resistive state. To realize a threshold function with the MTJ element, the threshold realization element is configured to switch the MTJ element from the first resistive state to the second resistive state in accordance with the threshold function. In this manner, the first resistive state and the second resistive state of the MTJ element may be utilized to represent an output of the threshold function. Since the MTJ element is non-volatile, the output of the threshold function is stored even if power to the threshold gate is interrupted. Furthermore, the threshold function implemented by the threshold gate may provide the output in the same manner as the output of a complex Boolean function requiring several Boolean gates. Thus, the threshold gate may be more compact, faster, and/or more space efficient than the Boolean gates required to generate the same output.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
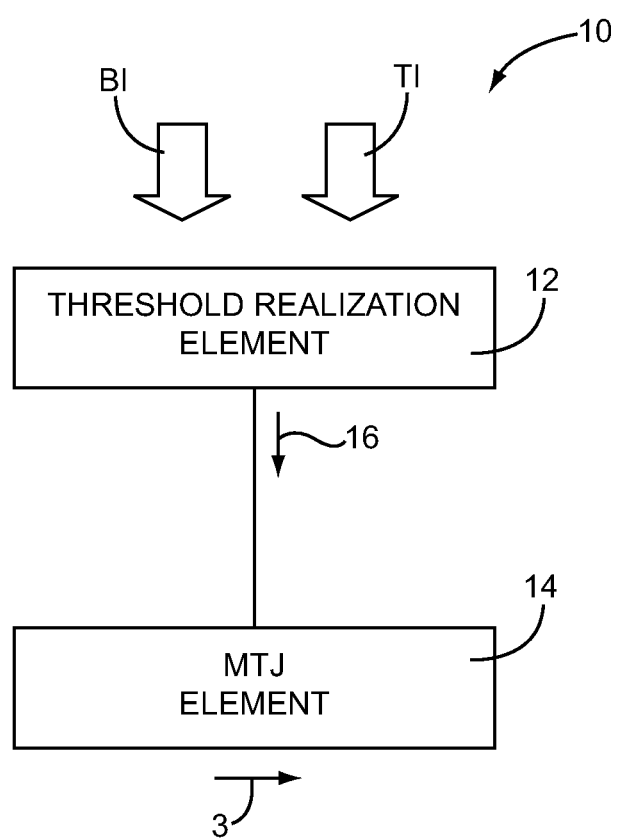
FIG. 1 illustrates a block diagram of an exemplary embodiment of a threshold gate that includes a threshold realization element and a magnetic tunnel junction (MTJ) element.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to threshold gates and related circuitry. Threshold gates are configured to implement a threshold function, which may map a Boolean input representing binary values to an output in the same manner as an implementation of the same function using conventional AND-OR Boolean gates. This may be advantageous because a single threshold gate may be able to generate the output while the equivalent representation of the Boolean function using AND-OR gates may require several Boolean gates.

Accordingly, the threshold gate may be more compact, faster, and/or more space efficient than the network of Boolean gates required to implement the same Boolean function.

A threshold gate is a non-decomposable primitive circuit that realizes a threshold function to provide an output by comparing some physical quantity such as charge, voltage or current. Below are exemplary equations that demonstrate various examples of threshold functions that may be implemented by threshold gates:

$$f_T(x_1, x_2 \ldots x_n) = \begin{cases} 1, & \text{if } \sum_{i=1}^{n} w_i x_i \geq T \\ 0, & \text{Otherwise} \end{cases} \quad (1)$$

$$f_T(x_1, x_2 \ldots x_n) = \begin{cases} 1, & \text{if } \sum_{i=1}^{n} w_i x_i \leq T \\ 0, & \text{Otherwise} \end{cases} \quad (2)$$

$$f_T(x_1, x_2 \ldots x_n) = \begin{cases} 0, & \text{if } \sum_{i=1}^{n} w_i x_i \geq T \\ 1, & \text{Otherwise} \end{cases} \quad (3)$$

$$f_T(x_1, x_2 \ldots x_n) = \begin{cases} 0, & \text{if } \sum_{i=1}^{n} w_i x_i \leq T \\ 1, & \text{Otherwise} \end{cases} \quad (4)$$

Different threshold gates may be utilized to operate in accordance with the various threshold functions shown above. In the equations above, parameters $x_1, x_2 \ldots x_n$ is a set of Boolean variables wherein each Boolean variable in the set of Boolean variables has a binary value. Parameters $w_1, w_2 \ldots w_n$ is a set of weights wherein each weight in the set of weights has an integer value. The T is a threshold value of the threshold function $f_T$. A Boolean function $f_B(x_1, x_2 \ldots x_n)$ may be implemented by a threshold gate if the threshold gate is operable to provide the weight values in the set of weights of threshold function $f_T(x_1, x_2 \ldots x_n)$ and the threshold value T of the threshold function such that the threshold function $f_T(x_1, x_2 \ldots x_n)$ implemented by the threshold gate maps the set of Boolean variables to the same output as the Boolean function $f_B(x_1, x_2 \ldots x_n)$. The threshold function $f_T(x_1, x_2 \ldots x_n)$ is represented by the set of weights and the threshold value in the following format $[w_1, w_2 \ldots w_n; T]$. The output of the Boolean function has a binary value and thus so does the output of the threshold function.

FIG. 1 illustrates one embodiment of a threshold gate 10 in accordance with this disclosure. The threshold gate 10 includes a threshold realization element 12 and a magnetic tunnel junction (MTJ) element 14. The MTJ element 14 is configured to be switchable from a first resistive state to a second resistive state and from a second resistive state to the first resistive state. The first resistive state and the second resistive state are each non-volatile resistive states. In other words, the MTJ element 14 can maintain the first resistive state and the second resistive state without external power. In the MTJ element 14, at least two different ferromagnetic layers are used. The two ferromagnetic layers are separated by tunneling barrier, which may be an electrical insulator. Whether the MTJ element 14 is in the first resistive state or the second resistive state depends on whether magnetic orientations of the different ferromagnetic layers on both sides of the tunneling barrier are aligned in parallel or in anti-parallel fashion. Thus, the MTJ element 14 is also configured to be switchable from a first magnetic orientation alignment state to a second magnetic orientation alignment state and from the second magnetic orientation alignment state to the first magnetic orientation state. The MTJ element 14 is a type of passive resistive element. In alternative embodiments, other types of passive resistive elements may be used, such as a memristor element, a phase change device (i.e., a phase change device used in Phase Change RAM), and/or the like. Like the MTJ element 14, the passive resistive element has two or more distinguishable non-volatile resistance states.

For example, in one embodiment, the first resistance state is a high resistance state and the second resistance state is a low resistance state. Furthermore, the first magnetic orientation alignment state is an anti-parallel magnetic orientation state in which the magnetic orientations for the ferromagnetic materials on opposing sides of the tunneling barrier are unaligned and in substantially opposite directions. Additionally, the second magnetic orientation alignment state is a parallel magnetic orientation state in which the magnetic orientations for the ferromagnetic materials on opposing sides of the tunneling barrier are aligned and in substantially the same directions. In this embodiment, the MTJ element 14 may be configured to generate a current of electrons tunneling across the tunneling barrier. Given the application of a magnetic field 3, a density of states of spin-up and spin-down electrons is provided on opposing sides of the tunneling barrier, which defines the magnetic orientations of the ferromagnetic materials. Accordingly, the MTJ element 14 is in the high resistance state as a result of the anti-parallel magnetic orientation state because there are less spin-up and spin-down electrons on opposing sides of the tunneling barrier to provide the tunneling current. Also, the MTJ element 14 is in the low resistance state as a result of the parallel magnetic orientation state because there more spin-up and spin-down electrons on opposing sides of the tunneling barrier to provide the tunneling current.

The threshold realization element 12 is configured to switch the passive resistive element from the first resistive state to the second resistive state in accordance with a threshold function. For instance, the threshold realization element 12 in FIG. 1 is configured to switch the MTJ element 14 from the first resistive state to the second resistive state in accordance with the threshold function. In other words, the threshold realization element 12 is configured to switch the MTJ element 14 from the first magnetic orientation alignment state to the second magnetic orientation alignment state in accordance with the threshold function. The first resistive state and/or the first magnetic orientation alignment state may be used so that the output represents a logical "1" or a logical "0" while the second resistive state and/or the second magnetic orientation alignment state may be used so that the output represents an antipodal logical "0" or a logical "1." The threshold realization element 12 may also be configured to switch the MTJ element 14 from the second resistance state (and the parallel magnetic orientation alignment state) to the first resistance state (and the anti-parallel magnetic orientation state or other circuitry (not shown) may be utilized to do this.

To switch the MTJ element 14 from the first resistive state to the second resistive state, the threshold realization element 12 is configured to generate a signal 16. The MTJ element 14 is operable to receive the signal 16 and is switchable from the first resistive state (and the first magnetic orientation alignment state) to the second resistive state (and the second magnetic orientation alignment state) in response to the signal 16 having a signal level greater than a switching magnitude. The signal level may be a voltage level and/or a current level of the signal 16 and the switching magnitude may be a switching voltage magnitude and/or a switching current magnitude. In one embodiment, the signal level of the signal 16 is greater than the switching magnitude for a given time duration, d. When the signal level of the signal 16 is greater than the switching magnitude for the time duration, d, there is an adjustment in the alignment of the magnetic orientations of the ferromagnetic materials. Thus, the MTJ element 14 is switched from the first magnetization orientation state (and the first resistive state) to the second magnetization orientation state (and the second resistive state) in response to the signal level of the signal 16 being greater than the switching magnitude for the given time duration, d.

In this embodiment, the threshold realization element 12 is configured to receive a Boolean input BI representing Boolean variables and a threshold input TI that indicates the threshold value T. The threshold realization element 12 is configured to adjust the threshold value of the threshold function so that the threshold value T corresponds to the switching magnitude. The Boolean input BI may represent the Boolean variables $x_1, x_2 \ldots x_n$ for the threshold function. The signal level of the signal 16 is provided by the threshold realization element 12 such that the signal level represents a scalar product of the set of Boolean variables $x_1, x_2 \ldots x_n$ and the set of weights of the threshold function. In one embodiment, the weight values for the weights $w_1, w_2 \ldots w_n$ of the threshold function are represented by a number of times that the Boolean variables $x_1, x_2 \ldots x_n$ are provided in the Boolean input BI.

Figure 2A:
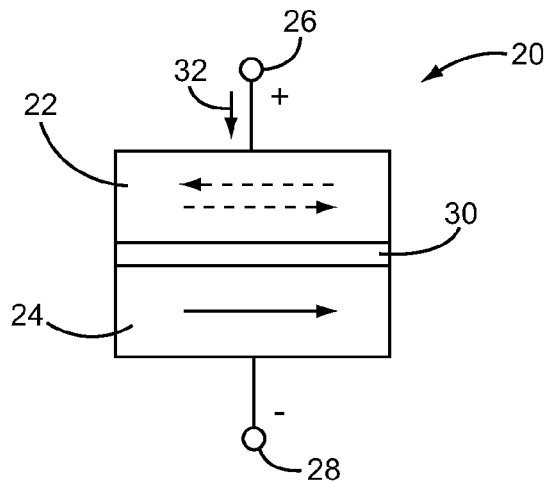
FIG. 2A illustrates one embodiment of the MTJ element shown in FIG. 1.

FIG. 2A illustrates one embodiment of an MTJ element 20, which is an example of the MTJ element 14 shown in FIG. 1. In this embodiment, the MTJ element 20 is a spin torque transfer (STT) MTJ element. The MTJ element 20 includes a first magnetic layer 22 and a second magnetic layer 24. The first magnetic layer 22 and second magnetic layer 24 are made from a ferromagnetic material. An electrical contact 26 is connected to the first magnetic layer 22 while a second electrical contact 28 is connected to the second magnetic layer 24. A tunneling barrier is defined between the first magnetic layer 22 and the second magnetic layer 24. In this embodiment, a dielectric layer 30 is provided between the first magnetic layer 22 and the second magnetic layer 24 to define the tunnel barrier.

As shown in FIG. 2A, the first magnetic layer 22 is magnetized so as to have a magnetic orientation state and the second magnetic layer 24 is magnetized so as to have a magnetic orientation state. Since the MTJ element 20 in this embodiment is an STT MTJ element, the first magnetic layer 22 is a free magnetic layer where the magnetic orientation state is adjustable while the second magnetic layer 24 is a fixed magnetic layer where the magnetic orientation state is fixed. The MTJ element 20 is switchable from a first magnetic orientation alignment state to a second magnetic orientation alignment state magnetic orientation. In one magnetic orientation alignment state the magnetic orientation state of the first magnetic layer 22 and the magnetic orientation state of the second magnetic layer 24 have one alignment with respect to one another. In another magnetic orientation alignment state, the magnetic orientation state of the first magnetic layer 22 and the magnetic orientation state of the second magnetic layer 24 have another alignment with respect to one another. The MTJ element 20 has a tunnel magnetoresistance (TMR) that defines a ratio of a resistance (R1) in a first resistive state and a resistance (R2) in a second resistive state. The R1 is the resistance of the MTJ element 20 in the first resistive state when the MTJ element 20 is one of the magnetic orientation alignment states and the resistance R2 is the resistance of the MTJ element 20 in the second resistive state in another one of the magnetic orientation alignment states.

Figure 2B:
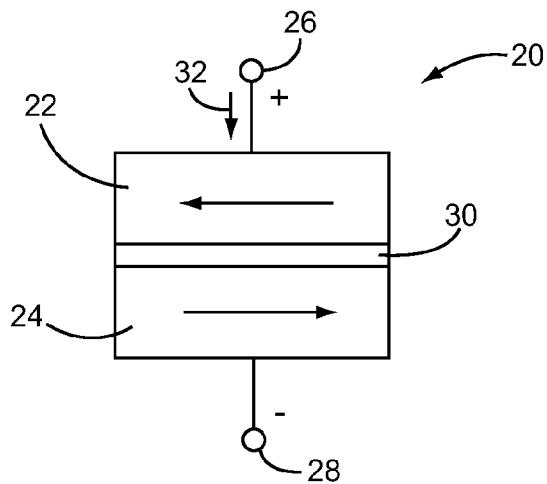
FIG. 2B illustrates one embodiment of the MTJ element shown in FIG. 2A in an anti-parallel magnetic orientation alignment state and in a high resistance state.

FIG. 2B illustrates the MTJ element 20 in an anti-parallel orientation alignment state. The MTJ element 20 is thus in a high resistance state in the anti-parallel orientation alignment state. In the anti-parallel orientation alignment state and the high resistance state, the magnetic orientation state of the first magnetic layer 22 and the magnetic orientation state of the second magnetic layer 24 are unaligned. A resistance ($R_{High}$) is the resistance of the MTJ element 20 in the high resistance state and in the anti-parallel orientation alignment state.

Figure 2C:
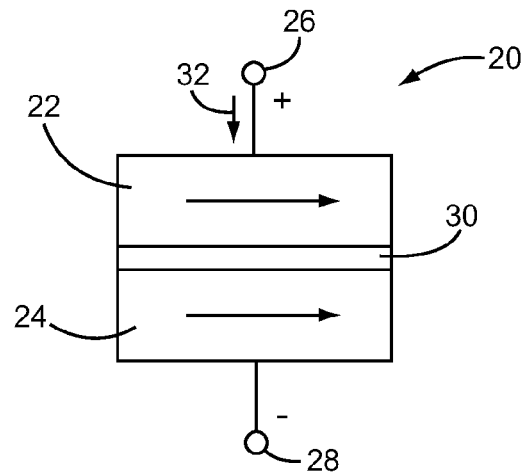
FIG. 2C illustrates one embodiment of the MTJ element shown in FIG. 2A in a parallel magnetic orientation alignment state and in a low resistance state.

FIG. 2C illustrates the MTJ element 20 in a parallel orientation alignment state. The tunnel magnetoresistance of the MTJ element 20 is thus in a low resistance state in the parallel orientation state. In the parallel orientation alignment state and the low resistance state, the magnetic orientation state of the first magnetic layer 22 and the magnetic orientation state of the second magnetic layer 24 are aligned. A resistance ($R_{Low}$) is the resistance of the MTJ element in the parallel orientation alignment state and in the low resistance state. In response to the signal level of the signal 16 being provided at the switching magnitude for the time duration d, the threshold realization element 12 shown in FIG. 1, is configured to adjust the magnetic orientation state of the free magnetic layer and thereby switches the MTJ element from the anti-parallel magnetic orientation state (and the high resistance state) to the parallel magnetic orientation state (and the low resistance state)

The TMR of the MTJ element 20 is given by:

$$TMR = (R_{High} - R_{Low})/R_{Low}.$$

Referring now to FIGS. 2A-2C, the MTJ element 20 in FIG. 2A is configured to receive a signal 32 having a signal level across the MTJ element 20. When the signal level is equal to or greater than a switching magnitude, the MTJ element 20 switches from the first magnetic orientation alignment state to the second magnetic orientation alignment state. Accordingly, when the signal level is equal to or greater than the switching magnitude, the MTJ element 20 switches from the first resistive state to the second resistive state. For example, the MTJ element 20 switches from the anti-parallel orientation state and the high resistive state in FIG. 2B to the parallel orientation state and the low resistive state in FIG. 2C when the signal level of the signal 16 is equal to or greater than the switching magnitude. In one embodiment, the signal 32 is a signal current having a current level l and the switching magnitude is a switching current magnitude lc. Additionally, when the negative of the signal level (signal 32 flowing from contact 28 to contact 26) is equal to or greater than the switching magnitude, the MTJ element 20 switches from the second magnetic orientation alignment state to the first magnetic orientation alignment state. Accordingly, when the negative of the signal level is equal to or greater than the switching magnitude, the MTJ element 20 switches from the second resistive state to the first resistive state. For example, the MTJ element 20 switches from the parallel orientation state and the low resistive state in FIG. 2C to the anti-parallel orientation state and the high resistive state in FIG. 2B when the negative of the signal level of the signal 16 is equal to the switching magnitude. In the embodiment described above, the negative of the signal 16 is the current magnitude l but in an opposite current direction across the MTJ element 20.

Figure 3:
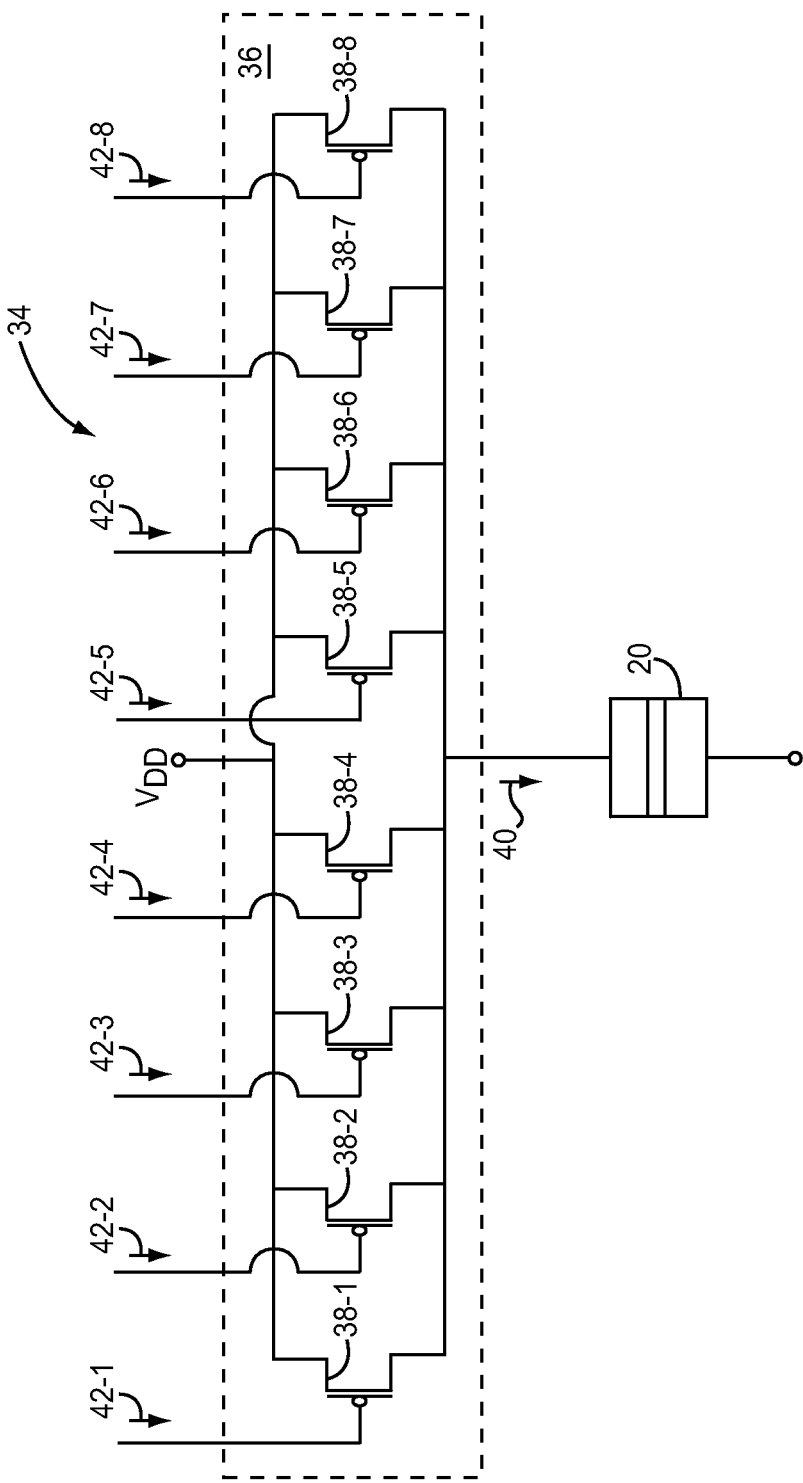
FIG. 3 illustrates one embodiment of the threshold gate shown in FIG. 1 with the MTJ element shown in FIG. 2 and a majority function element as one embodiment of the threshold realization element shown in FIG. 1.

FIG. 3 illustrates one embodiment of a threshold gate 34 having a majority function element 36 and the MTJ element 20 shown in FIGS. 2A-2C. The threshold gate 34 is one embodiment of the threshold gate 10 shown in FIG. 1, the majority function element 36 is one embodiment of the threshold realization element 12 shown in FIG. 1. The majority function element 36 has a plurality of transistors (referred to generically as transistors 38 and specifically as transistors 38-1, 38-2, 38-3, 38-4, 38-5, 38-6, 38-7, 38-8) coupled in parallel. In this example, the transistors 38 are P-channel Field Effect Transistors (PFETs) and more specifically are P-channel Metal on Oxide Field Effect Transistors (PMOSs). There are an integer number N of the transistors 38. The majority function element 36 is configured to generate a threshold realization current 40 at a current level provided in accordance with a number of the transistors 38 that are activated in the majority function element 36. The threshold realization current 40 is an embodiment of the signal 32 shown in FIGS. 2A-2C. A integer number, k, is a number of the transistors 38 that need to be activated for the current level of the threshold realization current 40 to be at or above the switching current magnitude lc. In other words, when k or more of the transistors 38 are activated, the majority function element 36 generates the threshold realization current 40 with the current level above the switching current magnitude lc, and thus the MTJ element 20 is switched from the first magnetization orientation alignment state and the first resistive state to a second magnetization orientation alignment state and the second resistive state. In this embodiment, the first magnetization orientation alignment state is the anti-parallel magnetization alignment state and the first resistive state is the high resistive state shown in FIG. 2B. The second magnetization orientation alignment state is the parallel magnetization alignment state and the second resistive state is the low resistive state shown in FIG. 2C. In other alternative embodiments, the first magnetization orientation alignment state is the parallel magnetization alignment state and the first resistive state is the low resistive state shown in FIG. 2C while the second magnetization orientation alignment state is the anti-magnetization alignment state and the second resistive state is the high resistive state in FIG. 2B. In these alternative embodiments, the threshold realization current 40 may be in an opposite direction or position of the fixed magnetic layer and the free magnetic layer may be oppositely disposed with respect to the threshold realization element 12.

The majority function element 36 was thus configured to implement a k/N majority function whose majority integer value is the integer number, k. If the transistors 38 each have a width, w, a current level, $l_k$ of the threshold realization current 40 drawn by k number of transistors (each of width w) should exceed the switch current magnitude lc of the MTJ element 20 at a current duration, d. Accordingly, if k or more of the transistors 38 are on, the MTJ element 20 is switched from high resistance state (and anti-parallel magnetization orientation state) to low resistance state (and parallel magnetization orientation state).

The majority element can thus realize a k/N majority function and any of its derivatives. The threshold gate 34 is thus programmable to implement any threshold function that corresponds to the k/N majority function or any of its derivatives. For example, the majority function element 36 is configured to receive a set of bit signals (referred to generically as element 42 and specifically to elements 42-1, 42-2, 42-3, 42-4, 42-5, 42-6, 42-7, 42-8). In this embodiment, the integer number N=8 and the integer number k is 4. More specifically, a gate of the transistor 38-1 receives a bit signal 42-1 that represents a bit, b1. A gate of the transistor 38-2 receives a bit signal 42-2 that represents a bit, b2. A gate of the transistor 38-3 receives a bit signal 42-3 that represents a bit, b3. A gate of the transistor 38-4 receives a bit signal 42-4 that represents a bit, b4. A gate of the transistor 38-5 receives a bit signal 42-5 that represents a bit, b5. A gate of the transistor 38-6 receives a bit signal 42-6 that represents a bit, b6. A gate of the transistor 38-7 receives a bit signal 42-7 that represents a bit, b7. A gate of the transistor 38-8 receives a bit signal 42-8 that represents a bit, b8.

To implement the majority function, the current level of the threshold realization current 40 is provided by the majority function element 36 in accordance with the majority function on the bit signals 42. More specifically, the majority function element 36 is configured to generate the threshold realization current 40 such that the current level corresponds with an aggregated sum of the bits b1-b8 represented by the bit signals 42. In particular, the current level of the threshold realization current 40 that monotonically corresponds with the aggregated sum (b1+b2+b3+b4+b5+b6+b7+b8) of the bits b1-b8 and the integer number k represents a majority value. It should be noted that the current level of the threshold realization current 40 might not be a linear function of the sum of the bits b1-b8. It could be a monotonic function of the sum of the bits b1-b8. The monotonic behavior of the threshold realization current 40 is all that is needed to realize a threshold function. For example, in an alternate embodiment, the threshold realization current 40 supplied from the active PMOS transistors is amplified and/or attenuated before feeding to a passive resistive element such as an STT-MTJ element.

In FIG. 3, the threshold gate 34 implements the majority function b1+b2+b3+b4+b5+b6+b7+b8<=k, where the integer number k equals a minimum number of the transistors 38 that are required to be activated so that the signal level of the threshold realization current 40 is above the switching current magnitude, lc. Thus, every threshold function that can be implemented by the majority function b1+b2+b3+b4+b5+b6+b7+b8<=k can be implemented by the threshold gate 34. This is because when k or more of the bits 1-8 are received as representing a logical 0, the majority function element 36 generates the threshold realization current 40 with the current level above the switching current magnitude lc. In this embodiment, with N=8 and k=4, forty-seven different threshold functions can be implemented by the majority function element 36. Accordingly, the majority function element 36 is programmable in accordance with a set of weights and a threshold value of a threshold function so that the majority function element 36 implements the threshold function. Assignments to each of the bits b1-b8 represented by the bit signals 42 are organized by the representation of (b1, b2, b3, b4, b5, b6, b7, b8).

As an example, the Boolean function f=ab+bc+ca, where a, b, c are each Boolean variables, corresponds to a threshold function having a set of weights and a threshold value of [1, 1, 1; 2]. With N=8 and k=4, the majority value is equal to 4; however, the threshold value of the threshold function is equal to 2. The threshold function is realized if one of the bits b1-b8 is assigned to the Boolean variable a, one of the bits of b1-b8 is assigned to the Boolean variable, b, one of the Boolean variables is assigned to the Boolean variable, c, two of the transistors 38 are maintained so as to be activated, and a remainder of the transistors 38 are deactivated.

More specifically, the majority function element 36 is programmable to realize the threshold function of [1, 1, 1; 2] by assigning the bits b1-b8 represented by the bit signals 42 in accordance with the set of weights and the threshold value. Boolean variable, a, is provided as the bit b1 represented by the bit signal 42-1. The Boolean variable, b, is provided as the bit b2 represented by the bit signal 42-2. The Boolean variable, c, is provided as the bit b3 represented by the bit signal 42-3. The bit b4 is provided as a logical 0 represented by the bit signal 42-4. The bit b5 is provided as a logical 0 represented by the bit signal 42-5. The bit b6 is provided as a logical 1 represented by the bit signal 42-6. The bit b7 is provided as a logical 1 represented by the bit signal 42-7. The bit b8 is provided as a logical 1 represented by the bit signal 42-8. This assignment of the threshold function [1, 1, 1; 2] to the majority function implemented by the majority function element 36 is represented as (a, b, c, 1, 1, 0, 0, 0). Thus, in this case, bits 1-3 are an example of the Boolean input BI with regard to FIG. 1 described above and bits 4-8 are an example of the threshold input TI with regard to FIG. 1.

For example, a Boolean function is a ∨ b ∨ c ∨ d ∨ e, where a, b, c, d, and e are Boolean variables. The Boolean function, a ∨ b ∨ c ∨ d ∨ e corresponds to a threshold function with a set of weights and a threshold value of [1, 1, 1, 1, 1; 1]. The majority function element 36 is programmable to realize the threshold function of [1, 1, 1, 1, 1; 1] by assigning the bits b1-b8 represented by the bit signals 42 in accordance with the set of weights and the threshold value. Boolean variable, a, is provided as the bit b1 represented by the bit signal 42-1. The Boolean variable, b, is provided as the bit b2 represented by the bit signal 42-2. The Boolean variable, c, is provided as the bit b3 represented by the bit signal 42-3. The Boolean variable, d, is provided as the bit b4 represented by the bit signal 42-4. The Boolean variable, e, is provided as the bit b5 represented by the bit signal 42-5. The bit b6 is provided as a logical 0 represented by the bit signal 42-6. The bit b7 is provided as a logical 0 represented by the bit signal 42-7. The bit b8 is provided as a logical 0 represented by the bit signal 42-8. This assignment of the threshold function [1, 1, 1, 1, 1; 1] to the majority function implemented by the majority function element 36 is represented as (a, b, c, d, e, 0, 0, 0). Thus, in this case, bits 1-5 are an example of the Boolean input BI with regard to FIG. 1 described above and bits 6-8 are an example of the threshold input TI with regard to FIG. 1.

As another example, a Boolean function of abcd corresponds to a threshold function with a set of weights and a threshold value of [1, 1, 1, 1; 4]. The majority function element 36 is programmable to realize the threshold function of [1, 1, 1, 1; 4] by assigning the bits b1-b8 represented by the bit signals 42 in accordance with the set of weights and the threshold value. Boolean variable, a, is provided as the bit b1 represented by the bit signal 42-1. The Boolean variable, b, is provided as the bit b2 represented by the bit signal 42-2. The Boolean variable, c, is provided as the bit b3 represented by the bit signal 42-3. The Boolean variable, d, is provided as the bit b4 represented by the bit signal 42-4. The bit b5 is provided as a logical 1 represented by the bit signal 42-5. The bit b6 is provided as a logical 1 represented by the bit signal 42-6. The bit b7 is provided as a logical 1 represented by the bit signal 42-7. The bit b8 is provided as a logical 1 represented by the bit signal 42-8. This assignment of the threshold function [1, 1, 1, 1; 4] to the majority function implemented by the majority function element 36 is represented as (a, b, c, d, 1, 1, 1, 1). Thus, in this case, bits 1-4 are an example of the Boolean input BI with regard to FIG. 1 described above and bits 5-8 are an example of the threshold input TI with regard to FIG. 1.

As another example, a Boolean function of ab ∨ (a ∨ b)(cd ∨ de ∨ ce) corresponds to a threshold function with a set of weights and a threshold value of [2, 2, 1, 1, 1; 4]. The majority function element 36 is programmable to realize the threshold function of [2, 2, 1, 1, 1; 4] by assigning the bits b1-b8 represented by the bit signals 42 in accordance with the set of weights and the threshold value. Boolean variable, a, is provided as the bit b1 represented by the bit signal 42-1. The Boolean variable, a, is also provided as the bit b2 represented by the bit signal 42-2. The Boolean variable, b, is provided as the bit b3 represented by the bit signal 42-3. The Boolean variable, b, is also provided as the bit b4 represented by the bit signal 42-4. The Boolean variable, c, is provided as the bit b5 represented by the bit signal 42-5. The Boolean variable, d, is provided as the bit b6 represented by the bit signal 42-6. The Boolean variable, e, is provided as the bit b7 represented by the bit signal 42-7. The bit b8 is provided as a logical 1 represented by the bit signal 42-8. This assignment of the threshold function [2, 2, 1, 1, 1; 4] to the majority function implemented by the majority function element 36 is represented as (a, a, b, b, c, d, e, 1). Thus, in this case, bits 1-7 are an example of the Boolean input BI with regard to FIG. 1 described above and bit 8 is an example of the threshold input TI with regard to FIG. 1. The bits 1 and 2 both represent the Boolean variable a to represent a weight value of two, and bits 3-4 both represent the Boolean variable b to represent a weight value of two.

Figure 4:
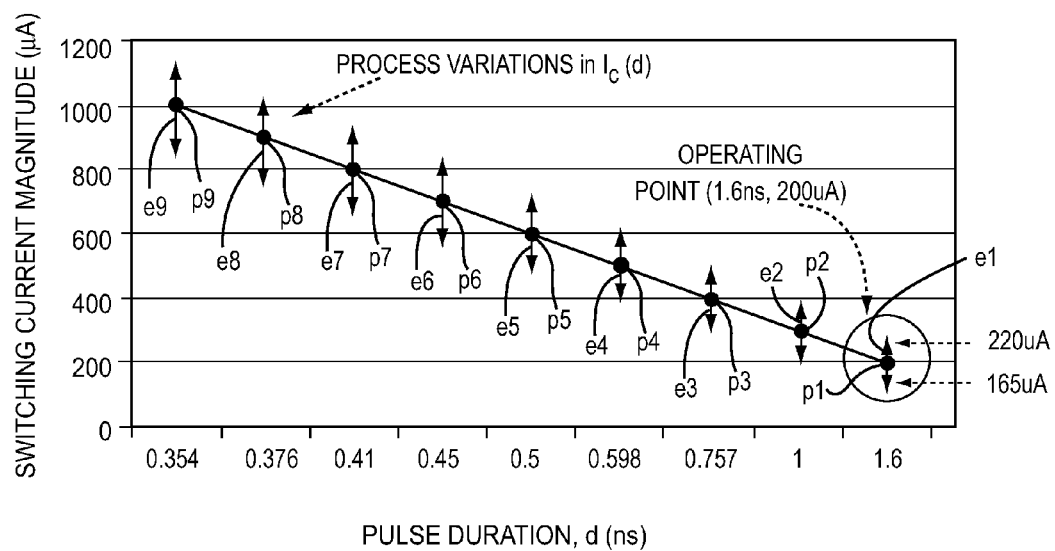
FIG. 4 is a graph illustrating a switching current magnitude as a function of pulse duration for a population of MTJ elements fabricated with the same topology as the MTJ element shown in FIG. 2A.

FIG. 4 illustrates a plot of a function lc(d) with the MTJ element 20 fabricated in accordance with the design parameters having parameter values in the table below.

| Variable | Description | Default Value |
|---|---|---|
| $T_{ox}$ | Dielectric Layer Thickness | 0.85 nm |
| Area | MTJ Surface | 65 nm × 65 nm × π/4 |
| $R_{low}$ | Resistance of Low Resistance State | 3K Ω |
| $R_{high}$ | Resistance of the High Resistance State | 6.6K Ω |
| TMR (0) | TMR ratio with zero bias voltage | 120% |

The table above illustrates design parameters for one model of the MTJ element 20. The function lc(d) is for the MTJ element 20 and shows values of the switching current magnitude lc mapped to pulse duration d at various operating points (referred to generically as p and specifically as p1, p2, p3, p4, p5, p6, p7, p8, p9). for the switching current magnitude lc of a population of the MTJ element 20, designed in accordance with the MTJ element 20. While a function lc(d) is actually exponential, the lc(d) is approximately linear over a limited range of the values of the pulse duration d. Error bars (referred to generically as e and specifically as e1, e2, e3, e4, e5, e6, e7, e8, e9) are the operation points p of the function lc(d) due to manufacturing variations in the switching current magnitude lc(d).

More specifically, the error bars e each specify that the signal level of the threshold realization current 40 has a probability of switching a randomly fabricated MTJ element (like the MTJ element 20 with the design parameters in the table above) from the high resistance state to the low resistance state is less than ϵ when the signal level is below a magnitude of lcmin(d) and a probability of 1-ϵ when the signal level of the threshold realization current 40 is above the magnitude lcmax(d) indicated by the error bar e. For example, for the error bar e1 at operating point p1 with a pulse duration of 1.6 nanoseconds, the magnitude of lcmin(d) is 165 μA and the magnitude of lcmax(d) is 220 μA. An expected magnitude is 220 μA.

To determine a width w of the transistors 38, simulations were performed with the data for the function lc(d) to ensure that the majority function of k=4 and N=8 is implemented by the majority function element 36. All simulation were performed with a $V_{DD}$=1V. An onset, M, is equal to the majority value k=4, which is a minimum number of the transistors 38 that are activated with the pulse duration d=1.6 ns such the MTJ element 20 is switched from the high resistance state (and the anti-parallel magnetic orientation alignment state) to the low resistance state (and the parallel magnetic orientation alignment state). An offset, m, is equal to the majority value k minus 1, (i.e., m=k−1), which is the maximum number of the transistors 38 that can be activated without the MTJ element 20 being switched from the from the high resistance state (and the anti-parallel magnetic orientation alignment state) to the low resistance state (and the parallel magnetic orientation alignment state). From the simulations, the width w of the transistors 38 is selected so that the current level of the threshold realization current 40 is generated above the lcmax(d), which in this example is 220 µA at the pulse duration d=1.6 ns, when the number of transistors 38 that are activated is equal to onset, M. Furthermore, from the simulations, the width w of the transistors 38 is selected so that the current level of the threshold realization current 40 is generated below the lcmin(d), which in this example is 165 µA at the pulse duration d=1.6 ns, when the number of transistors 38 that are activated is equal to offset, m. In this manner, the majority function element 36 is fabricated to ensure that the threshold realization current 40 is generated with the signal level above the switching current magnitude lc of the of the MTJ element 20 when a number equal to the onset M (i.e., M=k) of the transistors 38 is activated and with the current level below the switch current magnitude lc of the MTJ element 20 when a number equal to the offset, m, (i.e., m=k−1) of the transistors 38 are activated.

Figure 5:
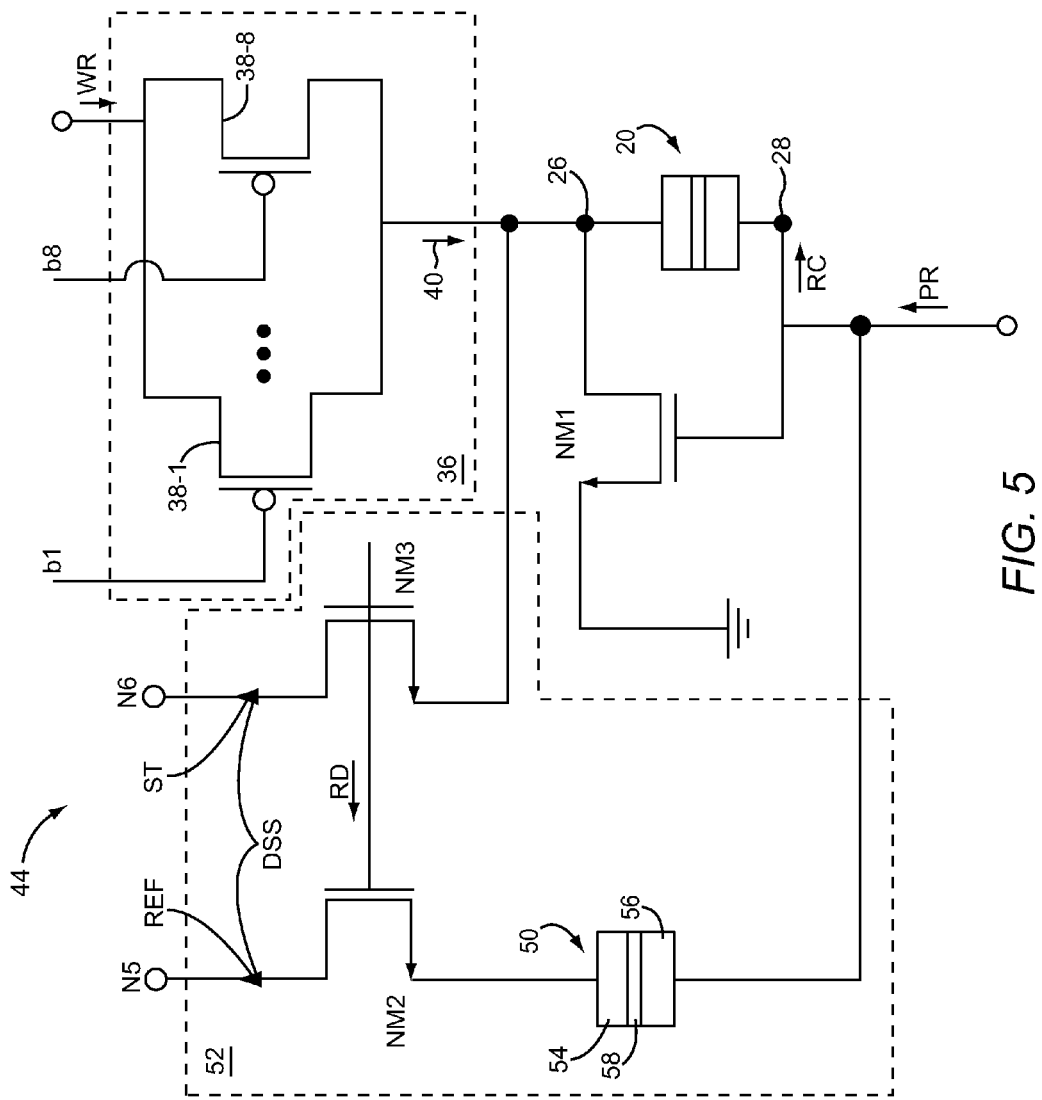
FIG. 5 illustrates another embodiment of a threshold gate shown in FIG. 1, wherein the threshold gate includes the majority function element shown in FIG. 3 and the MTJ element shown in FIG. 2A along with a differential state generation element.

FIG. 5 illustrates another embodiment of a threshold gate 44. The threshold gate 44 includes the majority function element 36 described above with respect to FIG. 3 and the MTJ element 20 described above with respect to FIG. 3. The majority function element 36 is thus configured to generate the threshold realization current 40 as described above with respect to FIG. 3. In this embodiment, the majority function element 36 is configured to receive a write signal, WR, at a terminal 46. The terminal 46 is connected to a drain of each of the transistors 38. Thus, a write pulse is provided in the write signal WR when the write signal WR is active. During the write pulse, the majority function element 36 is transparent to the bit signals 42 and the write pulse is provided for the pulse duration, d, which in this example is equal to 1.6 ns. In this embodiment, the write signal WR is at $V_{DD}$ when active and during the write pulse.

Accordingly, the threshold gate 44 is transparent while the write signal WR is active during the write pulse (write phase). When the threshold gate 44 is transparent and the write signal WR is active (write pulse, write phase) and/or asserted, the current level of the threshold realization current 40 is provided by the majority function element 36 in accordance with the majority function on the bit signals 42, as described above with respect to FIG. 3. More specifically, if the current level of the threshold realization current 40 is less than the switching current magnitude lc, the MTJ element 20 is maintained in the high resistive state (and the anti-parallel magnetic orientation alignment state). If the current level of the threshold realization current 40 is greater than the switching current magnitude lc, the MTJ element 20 is switched from the high resistive state (and the anti-parallel magnetic orientation alignment state) switches to the low resistance state (and the parallel magnetic orientation state), otherwise it remains in high resistance state. Once the write signal WR is inactive (unasserted) after the write pulse, the threshold gate 44 becomes opaque. In this embodiment, the write signal WR is inactive at ground. Since the MTJ element 20 is non-volatile, the MTJ element 20 is held at the high resistive state (and the anti-parallel magnetic orientation alignment state) or the low resistive state (and the parallel magnetic orientation alignment state) as provided while the write signal WR was active and during the write pulse (write phase).

The threshold gate 44 further includes a transistor NM1, a transistor NM2, transistor NM3 and another MTJ element 50. The threshold gate 44 shown in FIG. 5 is a differential threshold logic gate. Thus, in this embodiment, the threshold gate 44 has a differential state generation element 52. The differential state generation element 52 is configured to generate a differential state signal (DSS) that indicates whether the MTJ element 20 is in the high resistance state (and anti-parallel magnetic orientation alignment state) or whether the MTJ element 20 is in the low resistance state (and parallel magnetic orientation alignment state).

As shown in FIG. 5, the differential state generation element 52 includes the transistor NM2, the transistor NM3, and the MTJ element 50. The MTJ element 50 is also an STT-MTJ. The MTJ element 50 has a free magnetic layer 54 and a fixed magnetic layer 56 and a dielectric layer 58 that defines a tunnel barrier of the MTJ element 50. When a magnetic orientation of the free magnetic layer 54 and a magnetic orientation of the fixed magnetic layer 56 are unaligned, the MTJ element 50 is in a high resistive state and in an anti-parallel magnetic orientation alignment state. When a magnetic orientation of the free magnetic layer 54 and a magnetic orientation of the fixed magnetic layer 56 are aligned, the MTJ element 50 is in a low resistive state and in an anti-parallel magnetic orientation alignment state. However, the MTJ element 50 is configured to have a constant resistance given by $((R_{high}+R_{low})/2)$ where $R_{high}$ denotes the high resistance value of the MTJ element 20 and $R_{low}$ denotes the low resistance value of the MTJ element 20. It is possible to achieve such a resistance for the MTJ element 50 by changing its physical properties. However, in practice, this can be achieved by a particular network of four MTJ elements with preconfigured magnetic alignment states. Two MTJ elements having a resistance of $R_{high}$ are connected in parallel. Additionally, two or more MTJ elements having a resistance of $R_{low}$ are connected in parallel. This series-parallel arrangements of MTJ elements results in the same resistance of $((R_{high}+R_{low})/2)$ as the MTJ element 50 shown in FIG. 5.

The transistors NM2 and the transistor NM3 are configured to generate the differential state signal DSS while the read signal RD is active and/or asserted during a read pulse (read phase). In this embodiment, the transistor NM2 and the transistor NM3 are each N-channel FETs and in particular NMOSs. The gate of the transistor NM2 and the gate of the transistor NM3 both receive a read signal RD. A source of transistor NM2 is connected to the MTJ element 50 while a source of the transistor NM3 is coupled to the MTJ element 20. More specifically, the source of the transistor NM3 is connected between the majority function element 36 and the MTJ element 20. A drain of the transistor NM2 is coupled to a node N5, and a drain of the transistor NM3 is coupled to a node N6. The differential state signal DSS is output from both of the nodes N5, N6.

The differential state generation element 52 is configured to generate the differential state signal DSS such that the differential state signal DSS indicates whether the MTJ element 20 is in the high resistance state (and the anti-parallel magnetic orientation alignment state) or in the low resistance state (and the parallel magnetic orientation alignment state). This is done by asserting the read signal RD, which generates a read pulse (read phase) in the read signal RD and activates the read signal RD. The differential state generation element 52 is thus transparent to the state of the MTJ element 20 when the read signal RD is active and/or asserted during the read pulse (read phase). When read signal RD is active (read pulse, read phase), the transistor NM3 and the transistor NM2 are both enabled. Before the read signal RD is asserted, the voltages at the nodes N5 and N6, i.e., signals REF and ST, are both at the same voltage (whose value is somewhere between $V_{DD}$ and 0). Irrespective of whether the MTJ element 20 is in the high resistive state ($R_{high}$) or the low resistive state ($R_{low}$), its resistance is never equal to that of the MTJ element 50 (which is ($R_{high}+R_{low}$)/2). Therefore, when the read signal RD is asserted (during the read pulse (read phase)), the transistors NM2 and NM3 are enabled and the nodes N5 and N6 discharge through different resistances. This creates a voltage difference between the nodes N5 and N6 which may be amplified by an external sense amplifier circuit (not shown in FIG. 5).

For example, since the TMR of the MTJ element 50 has a TMR value of about ½ the TMR value for the TMR of the MTJ element 20, the transistor NM2 generates a reference signal REF having a reference voltage level. In this embodiment, the reference voltage level of the reference signal REF is at $V_{DD}/2$. As such, during the read pulse (read phase) and while the read signal RD is active and/or asserted, the reference voltage level (i.e., $V_{DD}/2$) is provided at the node N5. The reference signal REF is one part of the differential state signal DSS. Also, during the read pulse (read phase) and while the read signal RD is active and/or asserted, the transistor NM6 generates a state signal ST having a state voltage level. The state signal ST is another part of the differential state signal DSS.

If the MTJ element 20 is in the high resistance state (and the anti-parallel magnetic orientation alignment state), the voltage difference between the nodes N5 and N6 is negative, i.e., the voltage at the node N5 is lower than that of the node N6. The external sense amplifier circuit amplifies this difference and produces logical 0 as the output of threshold function. For example, a state voltage level of the state signal ST is approximately equal to $V_{DD}$. A voltage difference between the reference voltage level of the reference signal VREF and the state voltage level of the state signal ST is thus approximately $-V_{DD}/2$. In other words, a voltage difference between the node N5 and the node N6 is thus approximately $-V_{DD}/2$. On the other hand, if the MTJ element 20 is in the low resistance state (and the parallel magnetic orientation alignment state), the nodes N5 and N6 voltage difference is positive and the external sense amplifier amplifies this difference to produce logical 1 as the output of the threshold function. For example, a state voltage level of the state signal ST is approximately equal to a reference voltage level (i.e., in this example, ground). A voltage difference between the reference voltage level of the reference signal VREF and the state voltage level of the state signal ST is thus approximately $+V_{DD}/2$. In other words, a voltage difference between the node N5 and the node N6 is thus approximately $+V_{DD}/2$. When the read signal RD is inactive and/or unasserted after the read pulse (read phase), the differential state generation element 52 is opaque to the state of the MTJ element 20.

Next, the threshold gate 44 is also configured to receive a preset signal PR. At a beginning of a clock cycle [after the write pulse (write phase) when the write signal WR is inactive and the read pulse (read phase) of a previous clock cycle], the preset PR may become active and/or be asserted during a preset pulse (preset phase). The transistor NM1 operates as a reset device. In this embodiment, the transistor NM1 is an N-channel FET and more particularly an NMOS. A drain of the transistor NM1 is coupled between the majority function element 36, source of the transistor NM1 is coupled to ground, and a gate of the transistor NM1 is coupled to receive the preset signal PR. More specifically, the MTJ element 20 is coupled between the drain of the transistor NM1 and the gate of the transistor NM1. When the preset signal PR is active and/or asserted during the preset pulse (preset phase), the transistor NM1 generates a reset current RC across the MTJ element 20. The transistor NM1 is configured to generate the reset current RC such that a current level of the reset current RC is greater than the switching current magnitude, but in the opposite direction as the threshold realization current 40. In other words, the reset current RC has a current level greater than the switching current magnitude but a current direction opposite the current direction of the threshold realization current 40. Thus, the transistor NM1 is configured to ensure that the MTJ element 20 is in the high resistance state (and the anti-parallel magnetic orientation alignment state) by generating the reset current RC. For example, if the MTJ element 20 were being held in the high resistance state, the MTJ element 20 would be maintained in the high resistance state in response to the reset current RC. On the other hand, if the MTJ element 20 were being held in the low resistance state, the MTJ element 20 would switch from the low resistance state to the high resistance state in response to the reset current RC.

The write signal WR, the read signal RD, and the preset signal PR are complementary to one another and thus are not asserted at the same time. In other words, the write pulse (write phase), the read pulse (read phase), and preset pulse (preset phase) occur during different time intervals of a clock cycle. The write pulse (write phase), the read pulse (read phase), and preset pulse (preset phase) may be repeated every clock cycle as determined by a clock signal.

Figure 6:
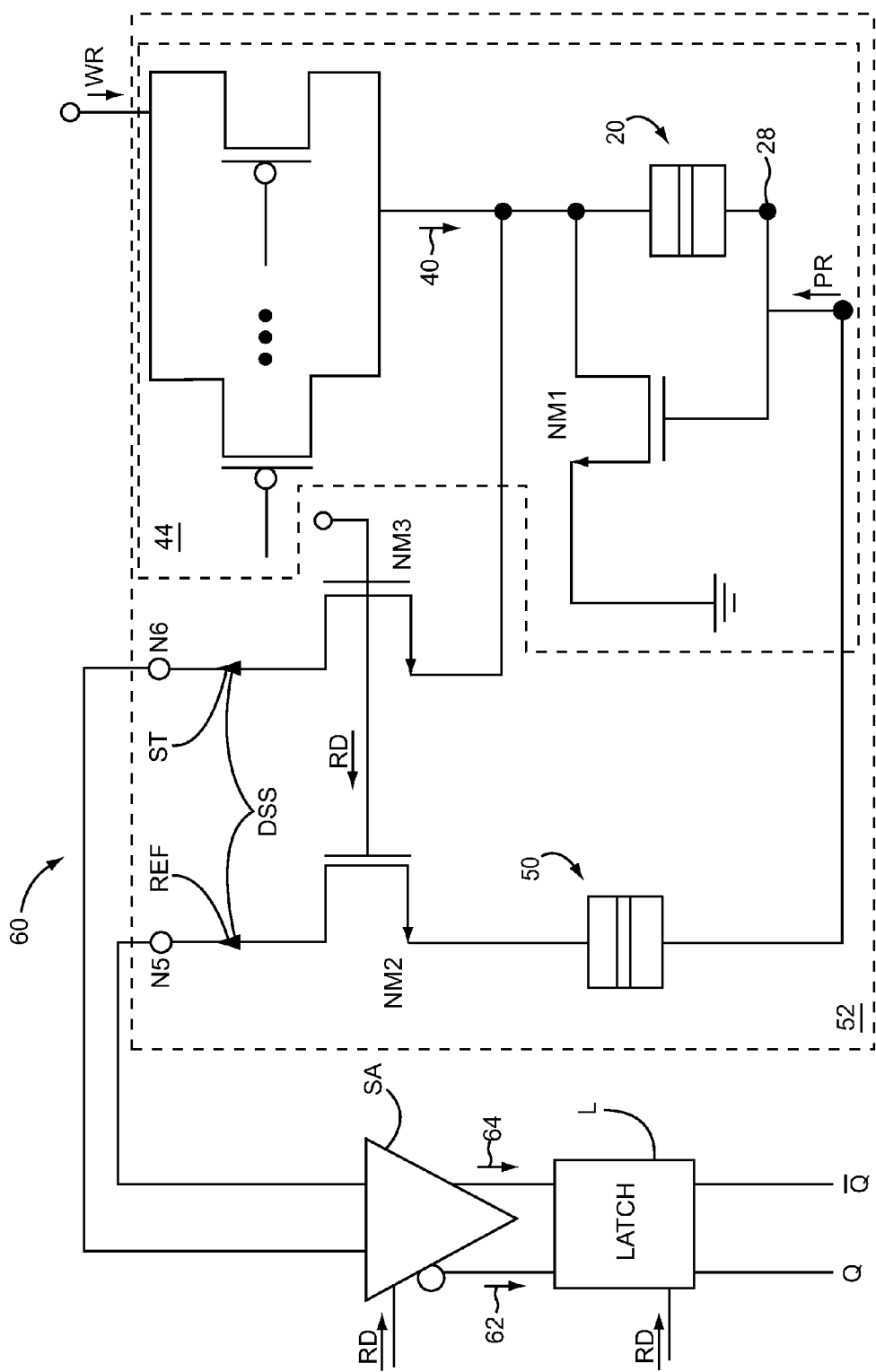
FIG. 6 illustrates one embodiment of a sequential state threshold logic element that includes the threshold gate shown in FIG. 5, a sensing amplifier element connected to the differential state generation element.

FIG. 6 illustrates a sequential state threshold logic element 60. The sequential state threshold logic element 60 includes the threshold gate 44 described above with respect to FIG. 5. In addition, the sequential state threshold logic element 60 includes a sense amplifier element SA and a latch L. The sense amplifier element SA is coupled to the nodes N5, N6 of the threshold gate 44. Accordingly, the sense amplifier element SA is configured to receive the differential state signal DSS from the threshold gate 44. The sense amplifier element SA is also configured to receive the read signal RD.

During the read pulse (read phase) and while the read signal RD is active and/or asserted, the sense amplifier element SA is configured to generate a first logic state signal 62 and a second logic state signal 64 in accordance with the voltage difference of the differential state signal DSS. The first logic state signal 62 and the second logic state signal 64 are logically inverted with respect to one another during the read pulse (read phase) and while the read signal RD is active and/or asserted. Accordingly, when the voltage difference of the differential state signal DSS between the node N5 and the node N6 is negative (for example, $-V_{DD}/2$), the sense amplifier element SA generates the first logic state signal 62 with a high voltage state (logical 1) (which in this example is around $V_{DD}$) and the second logic state signal 64 with a low voltage state (logical 0), (which in this example is around ground). Thus, as a result of the MTJ element 20 being in the high resistance state (and the anti-parallel magnetic orientation alignment), the first logic state signal 62 has the high voltage state (logical 1) and the second logic state signal 64 has the low voltage state (logical 0). On the other hand, when the voltage difference of the differential state signal DSS between the node N5 and the node N6 is positive (for example, $+V_{DD}/2$), the sense amplifier element SA generates the first logic state signal 62 with a low voltage state (logical 0) (which in this example is around ground) and the second logic state signal 64 with a high voltage state (logical 1), (which in this example is around $V_{DD}$). Thus, as a result of the MTJ element 20 being in the low resistance state (and the parallel magnetic orientation alignment), the first logic state signal 62 has the low voltage state (logical 1) and the second logic state signal 64 has the low voltage state (logical 0).

The latch L also is configured to receive the read signal RD. In this embodiment, the latch L is transparent during the read pulse (read phase) and while the read signal RD is active and/or asserted. In this embodiment, the latch L thus generates a bit output signal Q and an inverted bit output signal $\overline{Q}$. The bit output signal Q represents a bit and an inverted bit output signal $\overline{Q}$ represents an inversion of the same bit. More specifically, while the latch L is transparent, the bit output signal Q is generated by the latch L in a high voltage state (logical 1) or a low voltage state (logical 0), depending on the voltage state of the first logic state signal 62 and the voltage state of the second logic state signal 64. The inverted bit data signal $\overline{Q}$ is generated in the inverted voltage state of the bit output signal Q.

Outside the read pulse (read phase) and while the read signal RD is inactive and/or unasserted, the latch L is configured to be opaque to the first logic state signal 62 and the second logic state signal 64 and to hold the voltage state of the bit output signal Q and the voltage state of the inverted bit output signal $\overline{Q}$.

Figure 7:
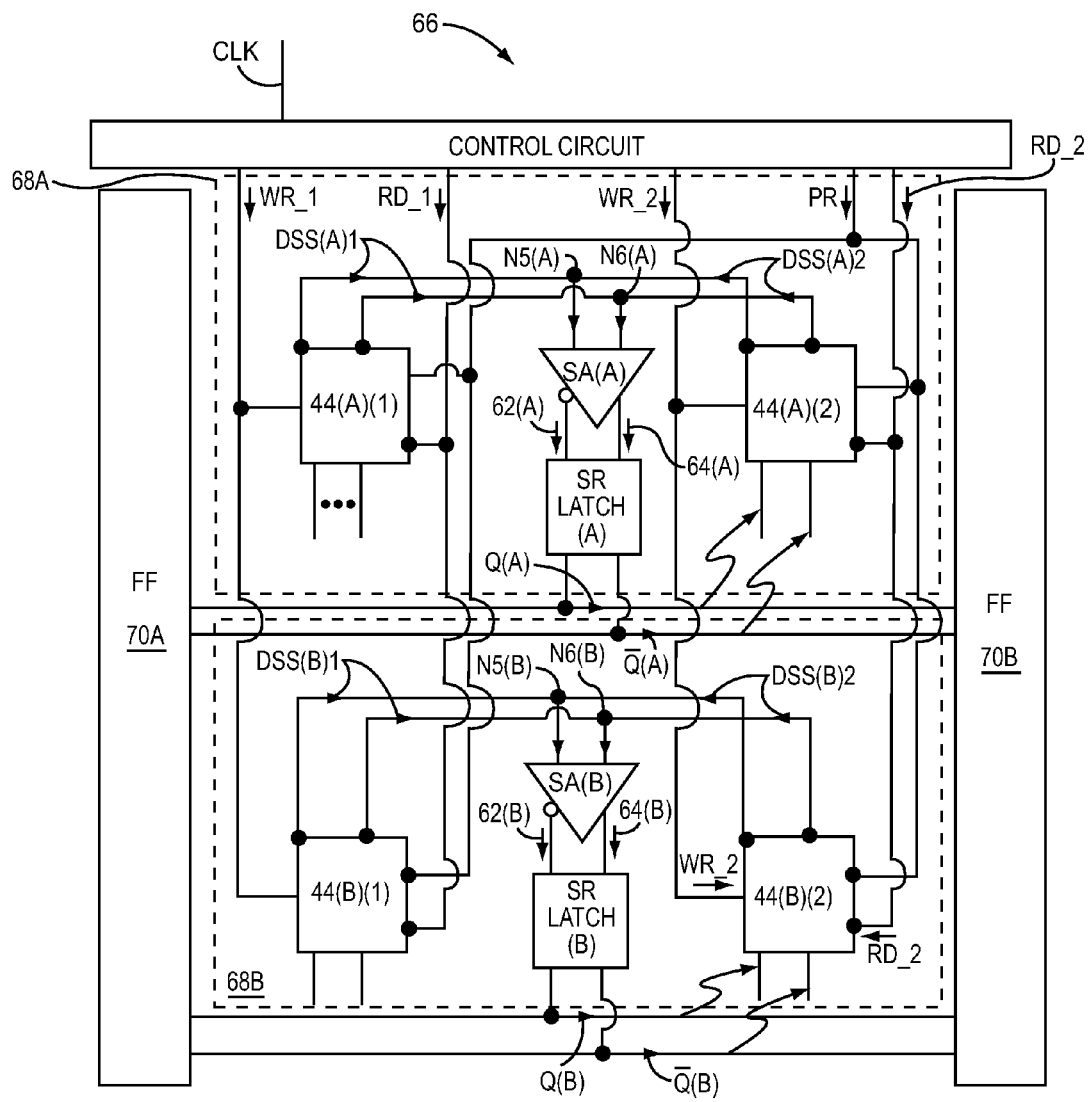
FIG. 7 illustrates one embodiment of a threshold logic block of threshold gates, which forms a threshold logic array, and wherein a pair of sequential state threshold logic elements each includes a pair of the threshold gates.

FIG. 7 illustrates a threshold logic array of threshold gates 44(A)(1), 44(A)(2), 44(B)(1), 44(B)(2). Each of the threshold gates 44(A)(1), 44(A)(2), 44(B)(1), 44(B)(2) has the same topology as the threshold gate 44 illustrated in FIG. 5. Thus, each of the threshold gates 44(A)(1), 44(A)(2), 44(B)(1), 44(B)(2) generates a corresponding differential state signal DSS(A)(1), DSS(A)(2), DSS(B)(1), DSS(B)(2), respectively. In this embodiment, the threshold logic array 66 is a threshold logic block wherein the threshold logic block is a 2×2 threshold logic array. Each of the threshold gates 44(A)(1), 44(A)(2), 44(B)(1), 44(B)(2) has the same configuration as the threshold gate 44 described above with respect to FIG. 5.

Letters (i.e., A and B) indicate a row of the threshold logic array 66. More specifically, within the threshold logic block, the Letter A indicates an upper row pair of threshold gates 44(A)(1) and 44(A)(2). Letter B indicates an low row pair of the threshold gates 44(B)(1) and 44(B)(2). Generically, the threshold gates 44(A)(1) and 44(A)(2) in the upper row pair and the threshold gates 44(B)(1) and 44(B)(2) in the lower row pair may be referred to as a row pair of the threshold gates 44(1) and 44(2). Also, generically, the differential state signal DSS(A)(1) and differential state signal DSS(A)(2) for the upper row pair and the differential state signal DSS(B)(1) and differential state DSS(B)(2) for the lower row pair may be referred to as the differential state signal DSS(1) and differential state signal DSS(2).

Numbers (i.e., 1 and 2) indicate a column of the threshold logic array 66. More specifically, within the threshold logic block, the number 1 indicates a left column pair the threshold gates 44(A)(1) and 44(B)(1). Number 2 indicates an right column pair of the threshold gates 44(A)(2) and 44(B)(2). Generically, the threshold gates 44(A)(1) and 44(B)(1) in the left column pair and the threshold gates 44(A)(2) and 44(B)(2) in the right column pair may be referred to as a column pair of the threshold gates 44(A) and 44(B). Also, generically, the differential state signal DSS(A)(1) and differential state signal DSS(B)(1) for the left row pair and the differential state signal DSS(A)(2) and differential state signal DSS(B)(2) for the right column pair may be referred to as the differential state signal DSS(A) and differential state signal DSS(B).

In this embodiment, a sequential state threshold logic element 68A includes the upper row pair of threshold gates 44(A)(1) and 44(A)(2). The sequential state threshold logic element 68A has a sense amplifier element SA(A) and an SR latch L(A). The sense amplifier element SA(A) receives both the differential state signal DSS(A)(1) from the threshold gate 44(A)(1) and the DSS(A)(2) the differential state signal DSS (A)(2). The sense amplifier element SA(A) is configured to generate a first logic state signal 62(A) as a set signal for the SR latch L(A) and a second logic state signal 64A as a reset signal for the SR latch L(A).

A sequential state threshold logic element 68B includes the low row pair of threshold gates 44(B)(1) and 44(B)(2). The sequential state threshold logic element 68B has a sense amplifier element SA(B) and an SR latch L(B). The sense amplifier element SA(B) receives both the differential state signal DSS(B)(1) from the threshold gate 44(B)(1) and the DSS(B)(2) the differential state signal DSS(B)(2). The sense amplifier element SA(B) is configured to generate a first logic state signal 62(B) as a set signal for the SR latch L(B) and a second logic state signal 64(B) as a reset signal for the SR latch L(B). Generically, the sequential state threshold logic elements 68A, 68B are referred to as sequential state threshold logic element 68 since both have the same topology.

A control circuit is configured to generate the preset signal PR, a write signal WR_1, a receive signal RD_1, a write signal WR_2, and a read signal RD_2. All of the threshold gates 44(A)(1), 44(A)(2), 44(B)(1), 44(B)(2) receive the preset signal PR. The left column pair of threshold gates 44(A)(1) and 44(B)(1) each receive the write signal WR_1 and the read signal RD_1. The right column pair of threshold gates 44(A)(1) and 44(B)(1) each receive the write signal WR_2 and the read signal RD_2. Thus, for each of the sequential state threshold logic elements 68, the threshold gate 44(1) receives the write signal WR_1 and the read signal RD_1. The threshold gate 44(2) receives the write signal WR_2 and the read signal RD_2. In each of the sequential state threshold logic elements 68 (i.e., both 68A, 68B), the sense amplifier element SA (i.e., both SA(A) and SA(B)) receive the OR of both of the read signals RD_1 and RD_2 (collectively called an RD signal). This OR gate (not shown explicitly) ensures that sense amplifiers SA(A) and SA(B) are active when either the read signal RD_1 is active (column 1 is active) or the read signal RD_2 is active (column 2 is active).

Feedforward device 70A and feedforward device 70B may include multiplexers and/or decoding circuits configured to route the appropriate bit signals through the bit lines a-z to the threshold gates 44(A)(1), 44(A)(2), 44(B)(1), 44(B)(2). The setup and hold timing for the bit signals on bit lines may be timed by a clock signal Clk, so that the feedforward device 70A and feedforward device 70 transfer the bit output signal Q and the inverted bit output signal $\overline{Q}$ from the SR Latches L(A), L(B) through the bit lines a-z so as to operate the threshold gates 44(A)(1), 44(A)(2), 44(B)(1), 44(B)(2) in accordance with a pipeline design.

Figure 8:
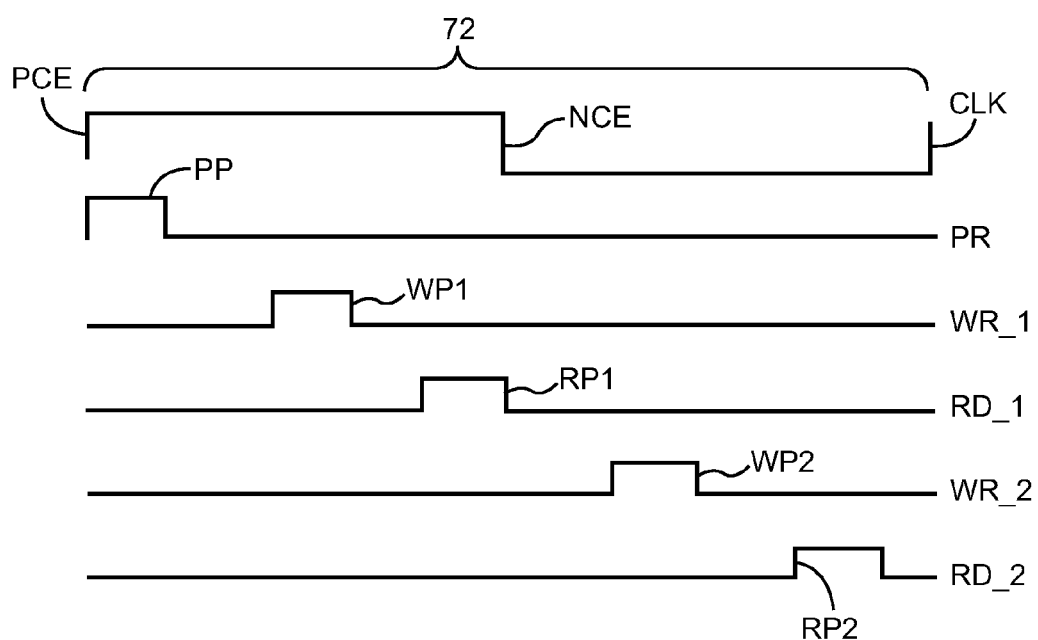
FIG. 8 is a timing diagram illustrating a clock signal, a first write signal, a first read signal, a second write signal, and a second read signal used to time the operation of the threshold logic block in FIG. 7.

FIG. 8 illustrates one embodiment of a timing diagram with a clock signal Clk, the preset signal PR, the write signal WR_1, the read signal RD_1, the write signal WR_2, and the read signal RD_2. The clock signal Clk, the preset signal PR, the write signal WR_1, the read signal RD_1, the write signal WR_2, and the read signal RD_2 are used to time the operation of the threshold logic array 66 shown in FIG. 7. Each of these signals are complementary and thus occur during different temporal portions of the clock cycle. The clock signal Clk may be an externally provided clock signal that is provided to the control circuit in order to time the operation of the threshold logic array 66 (shown in FIG. 7) and the feedforward devices 70A, 70B. In FIG. 8, the clock signal Clk, is illustrated during a single clock cycle 72. Thus, the preset signal PR, the write signal WR_1, the read signal RD_1, the write signal WR_2, and the read signal RD_2 are also each shown during a single clock cycle. As clock cycles of the clock signal Clk repeat, so do the wave forms of the write signal WR_1, the read signal RD_1, the write signal WR_2, and the read signal RD_2. As shown in FIG. 8, the preset signal PR is active (asserted) and provided with a preset pulse PP, the write signal WR_1 is active (asserted) and provided with a write pulse WP1, and the read signal RD_1 is active (asserted) and provided with a read pulse RP1. The write signal WR_2 is active (asserted) and provided with a write pulse WP2, and the read signal RD_2 is active (asserted) and provided with a read pulse RP2. All of the signals, i.e., PR, WR_1, RD_1, WR_2, RD_2, must occur between consecutive rising edges of clock signal Clk.

Referring now to FIGS. 7 and 8, initially all the threshold gates 44(A)(1), 44(A)(2), 44(B)(1), 44(B)(2) are preset by asserting (i.e., providing the preset pulse PP) the preset signal PR. In this embodiment, the operation of the threshold logic array 66 is done column wise. More specifically, the left column pair of threshold gates 44(A)(1) and 44(B)(1) in each of the sequential state threshold logic elements 68A and 68B receives a write-read signal pair (WR_1, RD_1). When the write signal WR_1 is asserted (i.e., the write pulse WP1 is provided), the left column pair of threshold gates 44(A)(1) and 44(B)(1) in each of the sequential state threshold logic elements 68A and 68B implements their respective threshold functions in accordance with bit signals from the bit lines a-z routed to the threshold gates 44(A)(1) and 44(B)(1).

The read signal RD_1 is then asserted (i.e., read pulse RP1 is provided) and the threshold gate 44(A)(1) generates the differential state signal DSS(A)(1) and the threshold gate 44(B)(1) generates the differential state signal DSS(B)(1). The sense amplifier element SA(A) generates the first logic state signal 62(A) and the second logic state signal 64(A) in accordance with the differential state signal DSS(A)(1). As a result, the SR latch L(A) then generates the bit output signal Q(A) and the inverted bit output signal $\overline{Q}$(A) in accordance with the first logic state signal 62(A) and the second logic state signal 64(A). Additionally, the sense amplifier element SA(B) generates the first logic state signal 62(B) and the second logic state signal 64(B) in accordance with the differential state signal DSS(B)(1). As a result, the SR latch L(B) then generates the bit output signal Q(B) and the inverted bit output signal $\overline{Q}$(B) in accordance with the first logic state signal 62(B) and the second logic state signal 64(B). After the read signal RD_1 is unasserted (i.e., after the read pulse RP1), the SR latch L(A) holds the bit output signal Q(A) and the inverted bit output signal $\overline{Q}$(A) and the SR latch L(B) holds the bit output signal Q(B) and the inverted bit output signal $\overline{Q}$(B).

The bit output signal Q(A) and the inverted bit output signal $\overline{Q}$(A) being held by the SR latch L(A) and the bit output signal Q(B) and the inverted bit output signal $\overline{Q}$(B) from the SR latch L(B) are then provided to the right column pair of the threshold gates 44(A)(2) and 44(B)(2) depending on the overall function mapped on to the overall threshold gate array. Repeaters can be provided to avoid fan out issues. In this embodiment, the right column pair of threshold gates 44(A)(2) and 44(B)(2) in each of the sequential state threshold logic elements 68A and 68B receive a write-read signal pair (WR_2, RD_2). When the write signal WR_2 is asserted (i.e., the write pulse WP2 is provided), the right column pair of threshold gates 44(A)(2) and 44(B)(2) in each of the sequential state threshold logic elements 68A and 68B implement their respective threshold functions in accordance with bit signals from the bit lines a-z routed to the threshold gates 44(A)(2) and 44(B)(2). The bit lines a-z may include the bit output signal Q(A) and the inverted bit output signal $\overline{Q}$(A) being held by the SR latch L(A) and the bit output signal Q(B) and the inverted bit output signal $\overline{Q}$(B) being held by the SR latch L(B).

The read signal RD_2 is then asserted (i.e., read pulse RP2 is provided) and the threshold gate 44(A)(2) generates the differential state signal DSS(A)(2) and the threshold gate 44(B)(2) generates the differential state signal DSS(B)(2). The sense amplifier element SA(A) generates the first logic state signal 62(A) and the second logic state signal 64(A) in accordance with the differential state signal DSS(A)(2). As a result, the SR latch L(A) then generates the bit output signal Q(A) and the inverted bit output signal $\overline{Q}$(A) in accordance with the first logic state signal 62(A) and the second logic state signal 64(A). Additionally, the sense amplifier element SA(B) generates the first logic state signal 62(B) and the second logic state signal 64(B) in accordance with the differential state signal DSS(B)(2). As a result, the SR latch L(B) then generates the bit output signal Q(B) and the inverted bit output signal $\overline{Q}$(B) in accordance with the first logic state signal 62(B) and the second logic state signal 64(B). After the read signal RD_2 is unasserted (i.e., after the read pulse RP2), the SR latch L(A) holds the bit output signal Q(A) and the inverted bit output signal $\overline{Q}$(A), and the SR latch L(B) holds the bit output signal Q(B) and the inverted bit output signal $\overline{Q}$(B). The next clock cycle may then begin and the bit lines a-z may include the bit output signal Q(A) and the inverted bit output signal $\overline{Q}$(A) being held by the SR latch L(A) and the bit output signal Q(B) and the inverted bit output signal $\overline{Q}$(B) being held by the SR latch L(B).

Figure 9:
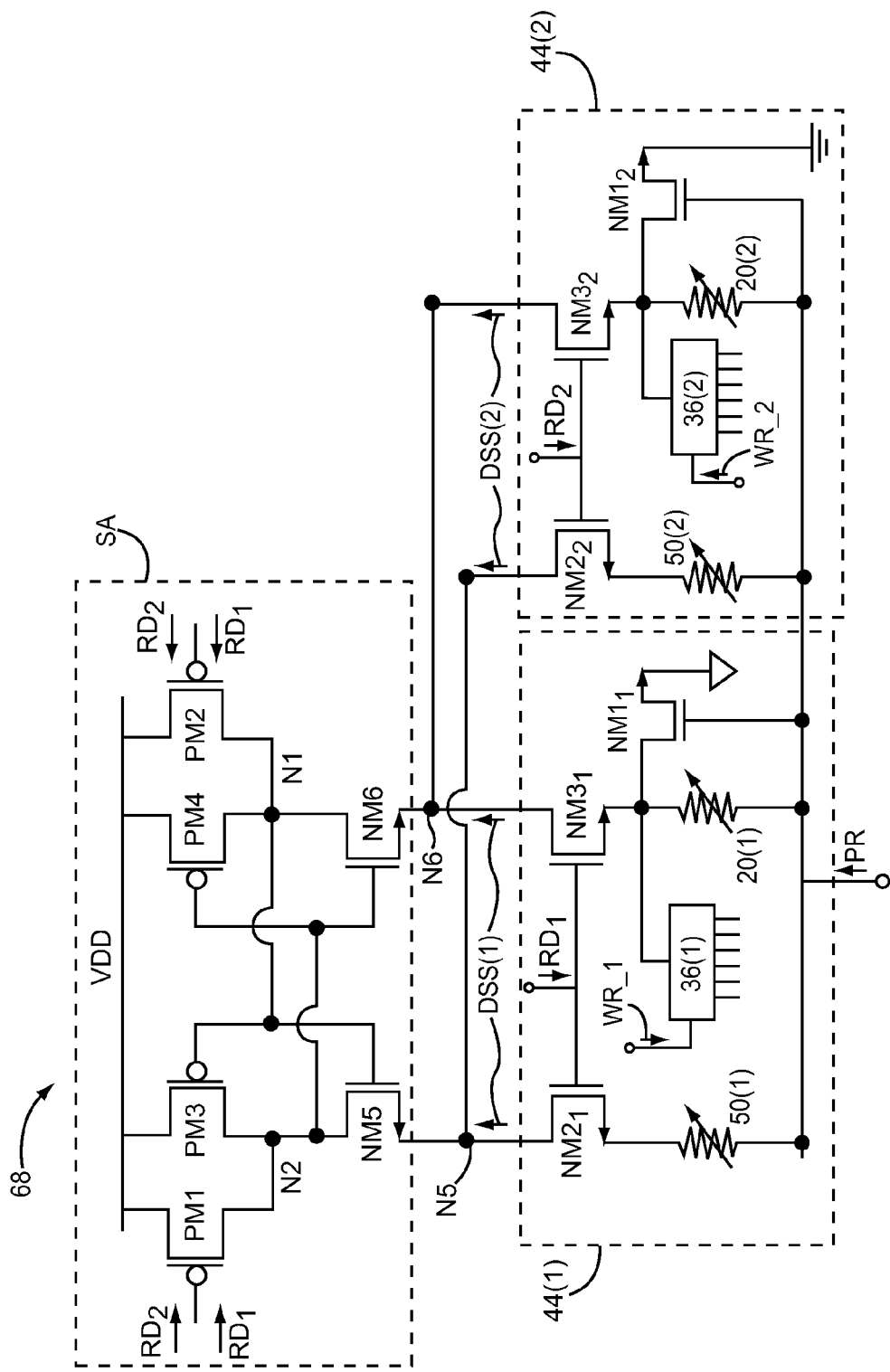
FIG. 9 illustrates one embodiment of one of the sequential state threshold logic elements shown in FIG. 7 having a pair of threshold gates and one embodiment of a sense amplifier element.

FIG. 9 illustrates one embodiment of a sequential state threshold logic element 68, where each of the sequential state threshold logic elements 68A, 68B in FIG. 7 may be provided in accordance with the topology of the sequential state threshold logic element 68. In this embodiment, the SR Latch is not illustrated for the sake of clarity. The sequential state threshold logic element includes the row pair of threshold gates 44(1) and 44(2) (the upper row pair of threshold gates 44(A)(1) and 44(A)(2) in FIG. 7 and the low row pair of the threshold gates 44(B)(1) and 44(B)(2) in FIG. 7) of the sequential state threshold logic element 68. Each of the threshold gates 44(1) and 44(2) is arranged in accordance with the threshold gate 44 illustrated in FIG. 5. Accordingly, the threshold gate 44(1) includes an MTJ element 20(1) (like the MTJ element 20 in FIG. 5), a majority function element 36(1) (like the majority function element 36 in FIG. 3), an MTJ element 50(1) (like the MTJ element 50 in FIG. 5), a transistor $NM1_1$ (like the transistor NM1 in FIG. 5), a transistor $NM2_1$ (like the transistor NM2 in FIG. 5), and a transistor $NM3_1$ (like the transistor NM3 shown in FIG. 5). The threshold gate 44(2) includes an MTJ element 20(2) (like the MTJ element 20 in FIG. 3). The threshold gate 44(2) includes an MTJ element 20(2) (like the MTJ element 20 in FIG. 5), a majority function element 36(2) (like the majority function element 36 in FIG. 3), an MTJ element 50(2) (like the MTJ element 50 in FIG. 5), a transistor $NM1_2$ (like the transistor NM1 in FIG. 5), a transistor $NM2_2$ (like the transistor NM2 in FIG. 5), and a transistor $NM3_2$ (like the transistor NM3 shown in FIG. 5).

Each of the threshold gates 44(1) and 44(2) in the row pair receive the preset signal PR. The majority function element 36(1) receives the write signal, WR_1 and the transistor $NM2_1$ and the transistor $NM3_1$ receive the read signal RD_1. The majority function element 36(1) thus implements its corresponding majority function and thus determines the state of the MTJ element 20(1) when the write signal WR_1 is asserted. The transistor $NM2_1$ and the transistor $NM3_1$ generate the differential state signal DSS(1) (the differential state signal DSSA(1) for sequential state threshold logic element 68A in FIG. 7 and the differential state signal DSSB(1) for sequential state threshold logic element 68B) based on the state of the MTJ element 20(1) when the read signal RD_1 is asserted. The majority function element 36(2) receives the write signal, WR_2 and the transistor NM2$_2$ and the transistor NM3$_2$ receive the read signal RD_2. The majority function element 36(2) implements its corresponding majority function and thus determines the state of the MTJ element 20(2) when the write signal WR_2 is asserted. The transistor NM2$_2$ and the transistor NM3$_2$ generate the differential state signal DSS(2) (the differential state signal DSSA(2) for sequential state threshold logic element 68A in FIG. 7 and the differential state signal DSSB(2) for sequential state threshold logic element 68B) based on the state of the MTJ element 20(2) when the read signal RD_1 is asserted. The sense amplifier element SA shown in FIG. 9 is configured to evaluate the state of the MTJ element 20(1) from the differential state signal DSS(1) and evaluate the state of the MTJ element 20(2) from the differential state signal DSS(2). In this embodiment, sense amplifier element SA has two PMOSs (PMOS PM1 and PMOS PM2) and inverters (PMOS PM3, NMOS NM5 and PMOS PM4, NMOS NM6) that are cross coupled between nodes N1 and N2, respectively. The NMOS NM5 and the NMOS NM6 receive the differential state signal DSS(1) from the threshold gate 44(1) and the differential state signal DSS(2) from the threshold gate 44(2). The nodes N1 and N2 are connected to the SR Latch (not shown).

Alternatively or additionally, the gates of the PMOSs PM1 and PM2 receive an output from an OR gate, wherein the read signals RD_1, RD_2 are inputs to the OR gate (i.e., output is equal to RD_1 v RD_2). Alternatively, threshold gates may be implemented where the first resistive state is a low resistive state and second resistive state is a high resistive state. During the write pulse, enough active transistors switch the MTJ element from a low resistive state to a higher resistive state, and not otherwise. The preset signal PR now ensures that the MTJ element starts in a low resistive state before application of the write pulse. The simplest change to accommodate the reversed meaning of final resistive states of MTJ element is to interchange the nodes N1 and N2 (i.e., interchange their connections to the S and R inputs of the SR latch) in the sense amplifier element SA shown in FIG. 9. These threshold gates are functionally identical to the threshold gates shown in FIG. 9.

A gate of the PMOS PM1 receives the read signals, RD_1, RD_2, i.e., RD_1 v RD_2. Additionally, a gate of the PMOS PM2 also receives the read signals RD_1, RD_2. The gates of the PMOS PM1 and PMOS PM2 are both in a low voltage state (ground) when both of the read signals, RD_1, RD_2 are unasserted. Thus, when both of the read signals RD_1, RD_2 are unasserted, the PMOS PM1 and the PMOS PM2 are activated and the nodes N1 and N2 are pre-charged to a high voltage state (~$V_{DD}$). This is called a reset phase. During the reset phase, the nodes N5 and N6 are both at $V_{DD}$-Vth. In contrast, the gates of the PMOS PM1 and the PMOS PM2 are both at the high voltage state when any of the read signals RD_1, RD_2 is asserted. Accordingly, the PMOS PM1 and the PMOS PM2 are both deactivated (turned OFF) when any one of the read signals RD_1, RD_2 is asserted, i.e., in an evaluation phase.

Accordingly, there are two evaluation phases during each clock cycle. When the read signal RD_1 is asserted and the read signal RD_2 is unasserted (first evaluation phase), the sense amplifier element SA evaluates the state of the MTJ element 20(1) based on the DSS(1). If the MTJ element 20(1) is in the high resistance state (and the anti-parallel magnetic orientation alignment), the DSS(1) has a negative voltage level difference from the node N5 to the node N6. Accordingly, more current is drawn from the node N2 than the node N1. Thus, the node N2 discharges faster than the node N1. As a result, the PMOS PM4 is activated, pulling the node N1 to a high voltage state (~$V_{DD}$ and a logical 1) and the node N2 to a low voltage state (~ground and a logical 0). In contrast, if the MTJ element 20(1) is in the low resistance state (and the parallel magnetic orientation alignment), the DSS(1) has a positive voltage level difference from the node N5 to the node N6. As a result, more current is drawn from the node N1 than the node N2. Thus, the node N1 discharges faster than the node N2. As a result, the PMOS PM3 is activated, pulling the node N2 to a high voltage state (~$V_{DD}$ and a logical 1) and the node N1 to a low voltage state (~ground and a logical 0).

When the read signal RD_2 is asserted and the read signal RD_1 is unasserted (second evaluation phase), the sense amplifier element SA evaluates the state of the MTJ element 20(2) based on the DSS(2). If the MTJ element 20(2) is in the high resistance state (and the anti-parallel magnetic orientation alignment), the DSS(2) has a negative voltage level difference from the node N5 to the node N6. Accordingly, more current is drawn from the node N2 than the node N1. Thus, the node N2 discharges faster than the node N1. As a result, the PMOS PM4 is activated, pulling the node N1 to a high voltage state (~$V_{DD}$ and a logical 1) and the node N2 to a low voltage state (~ground and a logical 0). In contrast, if the MTJ element 20(2) is in the low resistance state (and the parallel magnetic orientation alignment), the DSS(2) has a positive voltage level difference from the node N5 to the node N6. As a result, more current is drawn from the node N1 than the node N2. Thus, the node N1 discharges faster than the node N2. As a result, the PMOS PM3 is activated, pulling the node N2 to a high voltage state (~$V_{DD}$ and a logical 1) and the node N1 to a low voltage state (~ground and a logical 0). The nodes N1 and N2 provide the first logic state signal 62 (the first logic state signal 62A for the sequential state threshold logic element 68A in FIG. 7 and the first logic state signal 62B for the sequential state threshold logic element 68B) and the second logic state signal 64 (the second logic state signal 64A for the sequential state threshold logic element 68A in FIG. 7 and the second logic state signal 64B for the sequential state threshold logic element 68B).

Figure 10:
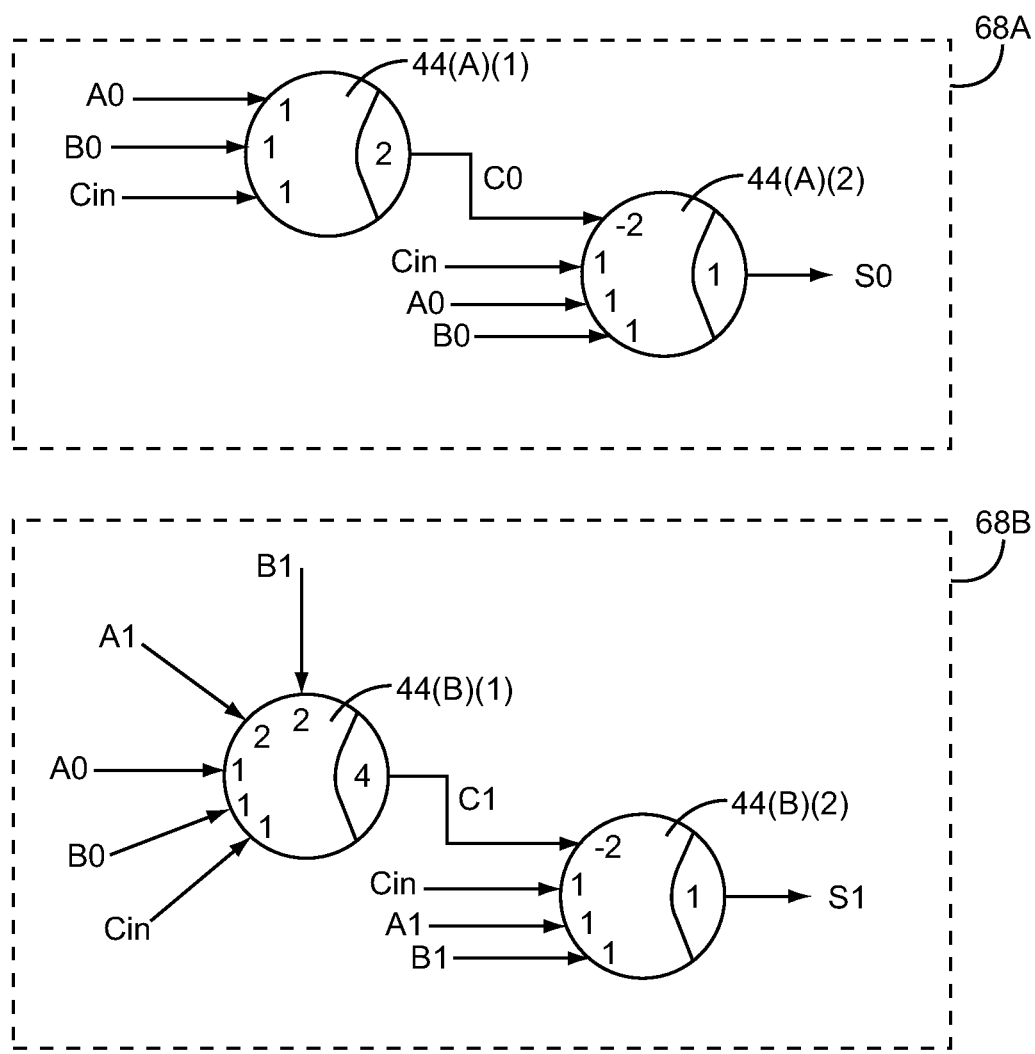
FIG. 10 illustrates a two bit carry look ahead (CLA) adder network consisting of abstract threshold logic gates.

FIG. 10 illustrates the threshold logic block in FIG. 7 programmed so as a two bit carry look-ahead (CLA) adder. The threshold gate 44(A)(1) has been programmed to compute a carry, with Boolean variables A0, B0 and Cin. As such, a majority function element (like the majority function element 36 shown in FIG. 3 and the majority function element 36(1) shown in FIG. 9) of the threshold gate 44(A)(1) has been programmed to implement a threshold function [1, 1, 1; 2]. The threshold function [1, 1, 1; 2] corresponds with a Boolean function, carry=ab+bc+ca, which computes a binary value of the Boolean variable C0. The threshold gate 44(A)(2) has been programmed to compute a sum, with Boolean variables C0, Cin, A0, B0. As such, a majority function element (like the majority function element 36 shown in FIG. 3 and the majority function element 36(2) shown in FIG. 9) of the threshold gate 44(A)(2) has been programmed to implement a threshold function implement a threshold function [−2, 1, 1, 1; 1]. The threshold function [−2, 1, 1, 1; 1] corresponds with a Boolean function, abc+(a+b+c)$\overline{\text{carry}}$, which computes a binary value of a Boolean variable S0. Accordingly, the threshold gates 44(A)(1) and 44(A)(2) of the sequential state threshold logic element 68A have been programmed to operate as a first stage adder for the two bit adder.

The threshold gate 44(B)(1) has been programmed to compute a carry, with Boolean variables B1, A1, A0, B0, Cin. As such, a majority function element (like the majority function element 36 shown in FIG. 3 and the majority function element 36(1) shown in FIG. 9) of the threshold gate 44(B)(1) has been programmed to implement a threshold function [2, 2, 1, 1, 1; 4]. The threshold function [2, 2, 1, 1, 1; 4] corresponds with a Boolean function, carry=2a+b+c+d+e, which computes a binary value of a Boolean variable C1. The threshold gate 44(B)(2) has been programmed to compute a sum, with Boolean variables C1, C0, A1, B1. As such, a majority function element (like the majority function element 36 shown in FIG. 3 and the majority function element 36(2) shown in FIG. 9) of the threshold gate 44(A)(2) has been programmed to implement a threshold function [−2, 1, 1, 1; 1]. The threshold function [−2, 1, 1, 1; 1] corresponds with a Boolean function, abc+(a+b+c)carry, which computes the binary value of a Boolean variable S1. Negative weights may be implemented through using inverters. Note that no extra inverters are needed since latch produces complemented outputs. Accordingly, the threshold gates 44(B)(1) and 44(B)(2) of the sequential state threshold logic element 68B have been programmed to operate as a second stage adder for the two bit adder.

Figure 11:
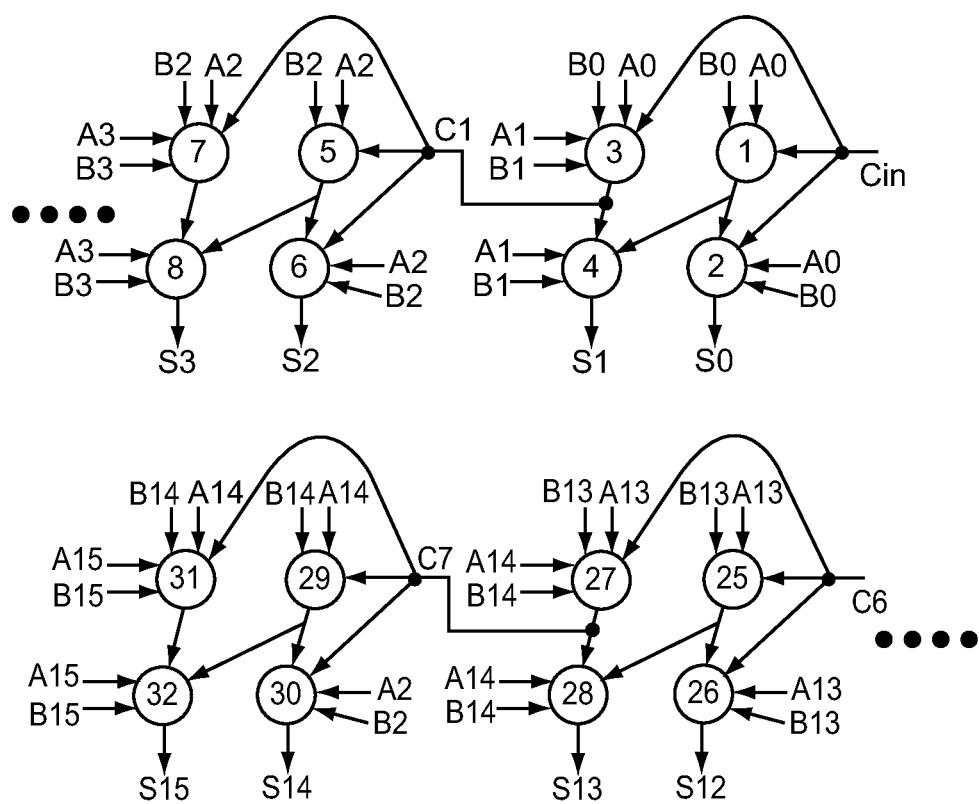
FIG. 11 illustrates one embodiment of a pattern of various four bit CLA adders implemented using several of the two bit CLA adders described above in FIG. 10.

FIG. 11 illustrates one embodiment of a four bit CLA adder implemented using several of the two bit CLA adders as described above in FIG. 10. This pattern of four bit CLA adders is repeated four times to construct a sixteen bit CLA adder having threshold gates 1-32. Each carry and sum one bit adder has been numbered and the correspondence is as follows. The threshold gates 1, 5, 9, 13, 17, 21, 25, and 29 implement the threshold function [1, 1, 1; 2] function, in the same manner as the threshold gate 44(A)(1) described above in FIG. 10. The threshold gates 2, 6, 10, 14, 18, 22, 26, and 30, implement the sum as [−2, 1, 1, 1; 1], in the same manner as the threshold gate 44(A)(2) described above in FIG. 10. The threshold gates 3, 7, 11, 15, 19, 23, 27, and 31 implement the second stage carry as [2, 2, 1, 1, 1; 4], in the same manner as the threshold gate 44(B)(1) described above in FIG. 10. The threshold gates 4, 8, 12, 16, 20, 24, 28, and 32 implement the sum as the threshold function [−2, 1, 1, 1; 1], in the same manner as the threshold gate 44(B)(2) described above in FIG. 10. Parallelism in the threshold gate blocks may be used to reduce the number of rows and column.

Those skilled in the art will recognize improvements and modifications to the preferred embodiments of the present disclosure. All such improvements and modifications are considered within the scope of the concepts disclosed herein and the claims that follow.

What is claimed is:

1. A threshold gate, comprising:
a magnetic tunnel junction (MTJ) element switchable from a first resistive state to a second resistive state; and
a threshold realization element comprising a plurality of transistors configured to switch the MTJ element from the first resistive state to the second resistive state in accordance with a threshold function.

2. The threshold gate of claim 1 wherein the first resistive state is a high resistive state and the second resistive state is a low resistive state.

3. The threshold gate of claim 1 wherein the threshold realization element is configured to generate a signal having a signal level and the MTJ element is operable to receive the signal from the threshold realization element and wherein:

the MTJ element is switchable from the first resistive state to the second resistive state in response to the signal level of the signal being greater than a switching magnitude; and
the threshold realization element is configured to provide the signal level of the signal greater than the switching magnitude so as to switch the MTJ element from the first resistive state to the second resistive state.

4. The threshold gate of claim 3 wherein the threshold realization element is operable to receive a threshold input that indicates a threshold value of the threshold function and is configured to adjust the threshold value of the threshold function so that the threshold value corresponds to the switching magnitude.

5. The threshold gate of claim 4 wherein the threshold realization element is configured to:
receive a Boolean input that represents a set of Boolean variables for the threshold function;
provide the signal level of the signal such that the signal level represents a scalar product of the set of Boolean variables and a set of weights of the threshold function.

6. The threshold gate of claim 1 wherein the MTJ element is a spin torque transfer MTJ element.

7. The threshold gate of claim 1 wherein the MTJ element comprises:
a first magnetic layer; and
a second magnetic layer, wherein a tunneling barrier is defined between the first magnetic layer and the second magnetic layer.

8. The threshold gate of claim 7 further comprising a dielectric layer that defines the tunneling barrier between the first magnetic layer and the second magnetic layer.

9. The threshold gate of claim 7 wherein:
the first magnetic layer is made from a first ferromagnetic material; and
the second magnetic layer is made from a second ferromagnetic material.

10. The threshold gate of claim 7 wherein:
the MTJ element is configured to be in the first resistive state as result of a magnetic orientation state of the first magnetic layer and a magnetic orientation state of the second magnetic layer having first alignment with respect to one another; and
the MTJ element is configured to be in the second resistive state as a result of the magnetic orientation state of first magnetic layer and the magnetic orientation state of the second magnetic layer having a second alignment with respect to one another.

11. The threshold gate of claim 10 wherein:
the first magnetic layer is a free magnetic layer, wherein the magnetic orientation state of the free magnetic layer is adjustable; and
the second magnetic layer is a fixed magnetic layer, wherein the magnetic orientation state of the fixed magnetic layer is fixed.

12. The threshold gate of claim 11 wherein the threshold realization element is configured to adjust the magnetic orientation state so that the magnetic orientation state of the free magnetic layer and the magnetic orientation state of the second magnetic layer is switched from the first alignment to the second alignment.

13. The threshold gate of claim 1 wherein the threshold realization element comprises a majority function element configured to implement a majority function.

14. The threshold gate of claim 13 wherein the majority function element comprises the plurality of transistors so that the majority function element is programmable in accordance to a set of weights and a threshold value of the threshold function so that the majority function element implements the threshold function.

15. The threshold gate of claim 13 wherein the majority function element is configured to receive binary bit signals representing bits, wherein the majority function element is configured to generate a threshold realization current such that a current level monotonically corresponds with an aggregated sum of the bits represented by the binary bit signals.

16. The threshold gate of claim 13 wherein
the MTJ element is operable to receive a threshold realization current and is switchable from the first resistive state to the second resistive state in response to a current level of the threshold realization current being greater than a switching current magnitude; and
the majority function element comprises the plurality of transistors and the plurality of transistor are a number, N of field effect transistors (FETs) and is configured to receive bit signals representing bits, the majority function element is configured to implement the majority function by generating the threshold realization current with the current level greater than the switching current magnitude when in response to at least a number k of the N number of the FETs being activated as a result of the bit signals.

17. The threshold gate of claim 16 wherein the N number of the FETs are coupled in parallel and the majority function element is configured to implement the majority function by switching the MTJ element from the first resistive state to the second resistive state in response to at least a number k of the N number of the FETs being activated.

18. The threshold gate of claim 13 wherein the majority function element comprises the plurality of transistors and the plurality of transistor are a number, N of field effect transistors (FETs) coupled in parallel, wherein the majority function element is configured to implement the majority function by switching the MTJ element from the first resistive state to the second resistive state in response to at least a number k of the N number of the FETs being activated.

19. The threshold gate of claim 18 wherein:
the majority function element is configured to generate a threshold realization current having a current level provided in accordance with how many of the N number of the FETs are activated and the MTJ element is operable to receive the threshold realization current from the majority function element;
the MTJ element is switchable from the first resistive state to the second resistive state in response to the current level of the threshold realization current being greater than a switching current magnitude; and
the majority function element is configured to provide the current level of the threshold realization current such that the current level is greater than the switching current magnitude in response to at least the number k of the N number of the FETs being activated.

20. The threshold gate of claim 13 wherein
the MTJ element is operable to receive a threshold realization current and is switchable from the first resistive state to the second resistive state in response to a current level of the threshold realization current being greater than a switching current magnitude; and
the majority function element comprises the plurality of transistors and the plurality of transistor are a number, N of field effect transistors (FETs) wherein the majority function element is configured to:
receive bit signals representing bits;
receive a write signal; and
implement the majority function by generating the threshold realization current with the current level greater than the switching current magnitude in response to at least a number k of the N number of the FETs being activated as a result of the bit signals and when the write signal is active.

21. The threshold gate of claim 14 further comprising a reset device wherein:
the MTJ element is further configured to receive a reset signal;
the reset device is configured to generate a reset current across the MTJ element when the reset signal is active, wherein a current level of the reset current is greater in magnitude than a negative of a switching current magnitude.

22. The threshold gate of claim 1 further comprising a differential state generation element configured to generate a differential state signal that indicates whether the MTJ element is in the first resistance state or the second resistance state.

23. The threshold gate of claim 22 wherein the differential state generation element is operable to receive a read signal and is configured to generate the differential state signal in response to the read signal being active.

24. A threshold gate, comprising:
a magnetic tunnel junction (MTJ) element switchable from a first magnetic orientation alignment state to a second magnetic orientation alignment state;
a threshold realization element comprising a plurality of transistors configured to switch the magnetic tunnel junction element from the first magnetic orientation alignment state to the second magnetic orientation alignment state in accordance with a threshold function.

25. The threshold gate of claim 24 wherein the first magnetic orientation alignment state is an anti-parallel magnetic orientation alignment state and the second magnetic orientation alignment state is a parallel magnetic orientation alignment state.

26. A threshold gate, comprising:
a passive resistive element having a first non-volatile resistance state and a second non-volatile resistance state, wherein the passive resistive element is switchable from a first resistive state to a second resistive state; and
a threshold realization element comprising a plurality of transistors configured to switch the passive resistive element from the first resistive state to the second resistive state in accordance with a threshold function.

27. The threshold gate of claim 26 wherein the passive resistive element is selected from a group consisting of a magnetic tunnel junction (MTJ) element, a memristor element, and a phase change device.

* * * * *